(12) United States Patent
Leight et al.

(10) Patent No.: US 6,367,065 B1
(45) Date of Patent: Apr. 2, 2002

(54) METHOD AND APPARATUS FOR N-NARY LOGIC CIRCUIT DESIGN TOOL WITH PRECHARGE CIRCUIT EVALUATION

(75) Inventors: Timothy S. Leight; Terence M. Potter; James S. Blomgren, all of Austin, TX (US)

(73) Assignee: Intrinsity, Inc., Austin, TX (US)

( * ) Notice: Subject to any disclaimer, the term of this patent is extended or adjusted under 35 U.S.C. 154(b) by 0 days.

(21) Appl. No.: 09/210,410

(22) Filed: Dec. 11, 1998

Related U.S. Application Data

(60) Provisional application No. 60/069,250, filed on Dec. 11, 1997.

(51) Int. Cl.[7] .............................................. G06F 17/50
(52) U.S. Cl. ................... 716/18; 716/2; 716/4; 716/5
(58) Field of Search ................... 716/18, 17, 2, 716/4, 5

(56) References Cited

U.S. PATENT DOCUMENTS

| | | | |
|---|---|---|---|
| 5,432,707 A | 7/1995 | Leung | |
| 5,452,239 A | * 9/1995 | Dai | 364/578 |
| 5,491,640 A | 2/1996 | Sharma et al. | |
| 5,519,627 A | 5/1996 | Mahmood et al. | |
| 5,661,661 A | 8/1997 | Gregory et al. | |
| 5,841,663 A | 11/1998 | Sharma et al. | |
| 5,867,395 A | 2/1999 | Watkins et al. | |
| 5,949,691 A | 9/1999 | Kurosaka et al. | |
| 5,953,519 A | * 9/1999 | Fura | 716/18 |
| 6,002,861 A | * 12/1999 | Butts | 716/17 |

* cited by examiner

*Primary Examiner*—Matthew Smith
*Assistant Examiner*—Thuan Do
(74) *Attorney, Agent, or Firm*—Booth & Wright, L.L.P.; Matthew J. Booth; Karen S. Wright

(57) ABSTRACT

A design tool to support design of a N-NARY logic circuit is described. The designer develops a syntax statement that comprises encoded information according to a defined syntax governing signal naming, logical function, and circuit performance. The encoded syntax statement describes the desired logical function of the N-NARY logic circuit and the specific configuration of transistors required to build the N-NARY logic circuit. The syntax statement is provided to a compiler that processes and decodes the syntax statement, and generates from the syntax statement a behavioral model of the N-NARY circuit and a physical circuit description of the N-NARY circuit.

30 Claims, 22 Drawing Sheets

METHOD AND APPARATUS FOR N-NARY LOGIC CIRCUIT DESIGN TOOL WITH PRECHARGE CIRCUIT EVALUATION

This application claims the benefits of the earlier filed U.S. Provisional Application Ser. No. 60/069,250, filed Dec. 11, 1997, which is incorporated by reference for all purposes into this application.

CROSS REFERENCE TO RELATED APPLICATIONS

This application is related to U.S. patent application Ser. No. 09/210,408, filed Dec. 11, 1998 (11.12.1998), now U.S. Pat. No. 6,289,497. Additionally, this application is related to copending U.S. patent application Ser. No. 09/210,024, filed Dec. 11, 1998 (11.12.1998).

BACKGROUND OF THE INVENTION

1. Field of the Invention

The present invention relates to digital computing, and more particularly to an N-NARY design tool for semiconductors that generates both a behavioral model and a physical model of a subcircuit design.

A portion of the disclosure of this patent document contains material that is subject to copyright protection. The copyright owner has no objection to the facsimile reproduction by anyone of the patent document or the patent disclosure, as the material appears in the Patent and Trademark Office patent file or records, but otherwise reserves all copyright rights whatsoever.

2. Description of the Related Art

N-NARY logic is a dynamic logic design style fully described in a copending patent application, U.S. patent application Ser. No. 09/019,355, filed Feb. 5, 1998, now U.S. Pat. No. 6,066,965, and titled "Method and Apparatus for a N-NARY logic Circuit Using 1-of-4 Signals", which is incorporated herein for all purposes and is hereinafter referred to as "The N-NARY Patent." (The present invention supports one feature of N-NARY logic not disclosed in The N-NARY Patent; that is, null values are supported by the present invention as discussed below.)

The N-NARY logic family supports a variety of signal encodings, including 1-of-4. In 1-of-4 encoding, four wires are used to indicate one of four possible values. In contrast, traditional static logic design uses two wires to indicate four values, as is demonstrated in Table 1. In Table 1, the $A_0$ and $A_1$ wires are used to indicate the four possible values for operand A: 00, 01, 10, and 11. Table 1 also shows the decimal value of an encoded 1-of-4 signal corresponding to the two-bit operand value, and the methodology by which the value is encoded using four wires.

TABLE 1

| 2-bit operand value | | N-NARY (1-of-4) Signal A Decimal Value | N-NARY (1-of-4) Signal A 1-of-4 wires asserted | | | |
|---|---|---|---|---|---|---|
| $A_1$ | $A_0$ | A | A[3] | A[2] | A[1] | A[0] |
| 0 | 0 | 0 | 0 | 0 | 0 | 1 |
| 0 | 1 | 1 | 0 | 0 | 1 | 0 |
| 1 | 0 | 2 | 0 | 1 | 0 | 0 |
| 1 | 1 | 3 | 1 | 0 | 0 | 0 |

"Traditional" dual-rail dynamic logic also uses four wires to represent two bits, but the dual-rail scheme always requires two wires to be asserted. In contrast, as shown in Table 1, N-NARY logic only requires assertion of one wire. The benefits of N-NARY logic over dual-rail dynamic logic, such as reduced power and reduced noise, should be apparent from a reading of the N-NARY Patent. All signals in N-NARY logic, including 1-of-4, are of the 1-of-N form where N is any integer greater than one. A 1-of-4 signal requires four wires to encode four values (0–3 inclusive), or the equivalent of two bits of information. More than one wire will never be asserted for a valid 1-of-N signal. Similarly, N-NARY logic requires that a high voltage be asserted on only one wire for all values, even 0.

Any one N-NARY logic gate may comprise multiple inputs and/or outputs. In such a case, a variety of different N-NARY encodings may be employed. For instance, consider a gate that comprises two inputs and two outputs, where the inputs are a 1-of-4 signal and a 1-of-2 signal and the outputs comprise a 1-of-4 signal and a 1-of-3 signal. Variables such as P, Q, R, and S may be used to describe the encoding for these inputs and outputs. One may say that one input comprises 1-of-P encoding and the other comprises 1-of-Q encoding, wherein P equals two and Q equals four. Similarly, the variables R and S may be used to describe the outputs. One might say that one output comprises 1-of-R encoding and the other output comprises 1-of-S encoding, wherein R equals four and S equals 3. Through the use of these, and other, additional variables, it is possible to describe multiple N-NARY signals that comprise a variety of different encodings.

Supporting a new logic design style requires the invention of new coding techniques to support the computer-aided design of logic circuits and their constituent subcircuits. The N-NARY logic design style is no exception. The need to perform logical verification of circuits as well as provide a means of describing the physical design and interconnectivity of these circuits creates conflicting requirements. Physical circuit descriptions do not accidentally provide automatic means of logically verifying their correctness, and logical descriptions do not accidentally provide information on how each transistor in a circuit is connected to its neighbors.

Logic design tools of the prior art, such as VHDL and Verilog, keep libraries of subcircuits, or cells. These library cells represent significant effort expended to perform two separate tasks. To use the prior art tools, one must first develop a schematic representation of the configuration of the transistors for the cell under design. Second, one must develop a behavior model of the particular logical operation desired from the cell. In conjunction with this two-step process, there is considerable effort required to verify that the behavioral model and the schematic "match up" to create the desired functionality.

In contrast, the tool of the present invention does not require a semiconductor designer to develop a schematic and a separate behavioral model that must be verified against each other. Instead, the design tool of the present invention separately compiles both a behavioral model and a physical circuit description from one syntax statement. The present invention guarantees that the schematic and the behavioral model will "match up," greatly reducing the man-hours needed to design semiconductor circuits. This process is particularly helpful in the design of N-NARY semiconductor circuits, since the N-NARY logic family creates the opportunity for various physical circuit descriptions that perform the same logical function. The problem of matching a behavioral model with a physical description therefore becomes critical in the context of N-NARY circuit design.

SUMMARY OF THE INVENTION

The present invention comprises a method and apparatus for a syntax statement that describes the logical and physical characteristics of a logic gate. The syntax statement of the present invention is a component of a hardware definition language. The syntax statement further comprises a signal naming convention and one or more gate instantiations that are built according to the signal naming convention. The signal naming convention further comprises one or more of the following: an optical bit field, an optional descriptor field, a signal degree field, an evaluation field, and a clock phase field. Additionally, the gate instantiations further comprises one or more gate output signal variables, one or more gate operators, and one or more gate expressions. And, the gate expression further comprises one or more of the following: a mux select expression, an arithmetic expression, a logical expression, a multiple output expression, a capacitance isolation expression, or a shared node expression. Further, the gate output signal variable further comprises one or more of the following: an optional bit field, an optional descriptor field, a signal degree field, an evaluation field, and a clock phase field. One embodiment of the present invention describes N-NARY logic and N-NARY logic circuits. Another embodiment of the present invention describes CMOS logic and CMOS logic circuits. And finally, another embodiment of the present invention can describe the same logical function of the logic circuit with physically different arrangements of individual transistors.

Additionally, the present invention comprises a design tool to support design of a N-NARY logic circuit. The designer develops a syntax statement that comprises encoded information according to a defined syntax governing signal naming, logical function, and circuit performance. The encoded syntax statement describes the desired logical function of the N-NARY logic circuit and the specific configuration of transistors required to build the N-NARY logic circuit. The syntax statement is provided to a compiler that processes and decodes the syntax statement, and generates from the syntax statement a behavioral model of the N-NARY circuit and a physical circuit description of the N-NARY circuit.

Further, the present invention comprises a design tool to support design of logic circuits. The designer develops a syntax statement that comprises encoded information according to a defined syntax governing signal naming, logical function, and circuit performance. The encoded syntax statement describes the desired logical function of the logic circuit and the specific configuration of transistors required to build the logic circuit. The syntax statement is provided to a compiler that processes and decodes the syntax statement, and generates from the syntax statement a behavioral model of the logic circuit and a physical circuit description of the logic circuit.

BRIEF DESCRIPTION OF THE DRAWINGS

To further aid in understanding the invention, the attached drawings help illustrate specific features of the invention and the following is a brief description of the attached drawings:

FIGS. 10A and 10B depict the transistor arrangement described by Equations 1 and 2, respectively.

FIG. 10C depicts the transistor arrangement described by the gate expression ((sig_4H0=0)*0).

FIG. 10D depicts the transistor arrangement described by the gate expression (0*(sig1_2H0=0)|(1*(sig1_2H0=1).

DETAILED DESCRIPTION OF THE INVENTION

The present invention relates to an N-NARY semiconductor design tool. From a syntax statement that characterizes a subcircuit, the present invention generates both a logical description, or behavioral model, that describes the logical function of the subcircuit and a physical circuit description that deterministically describes the transistor arrangement that will perform the logic function described by the syntax statement. This disclosure describes numerous specific details that include specific formats, structures, circuits, and logic functions in order to provide a thorough understanding of the present invention. One skilled in the art will appreciate that one may practice the present invention without these specific details. Additionally, this disclosure does not describe in detail the N-NARY design style nor some well-known structures, such as P-FETs and N-FETs, in order not to obscure the present invention.

N-NARY Logic Gates

Figure 2:
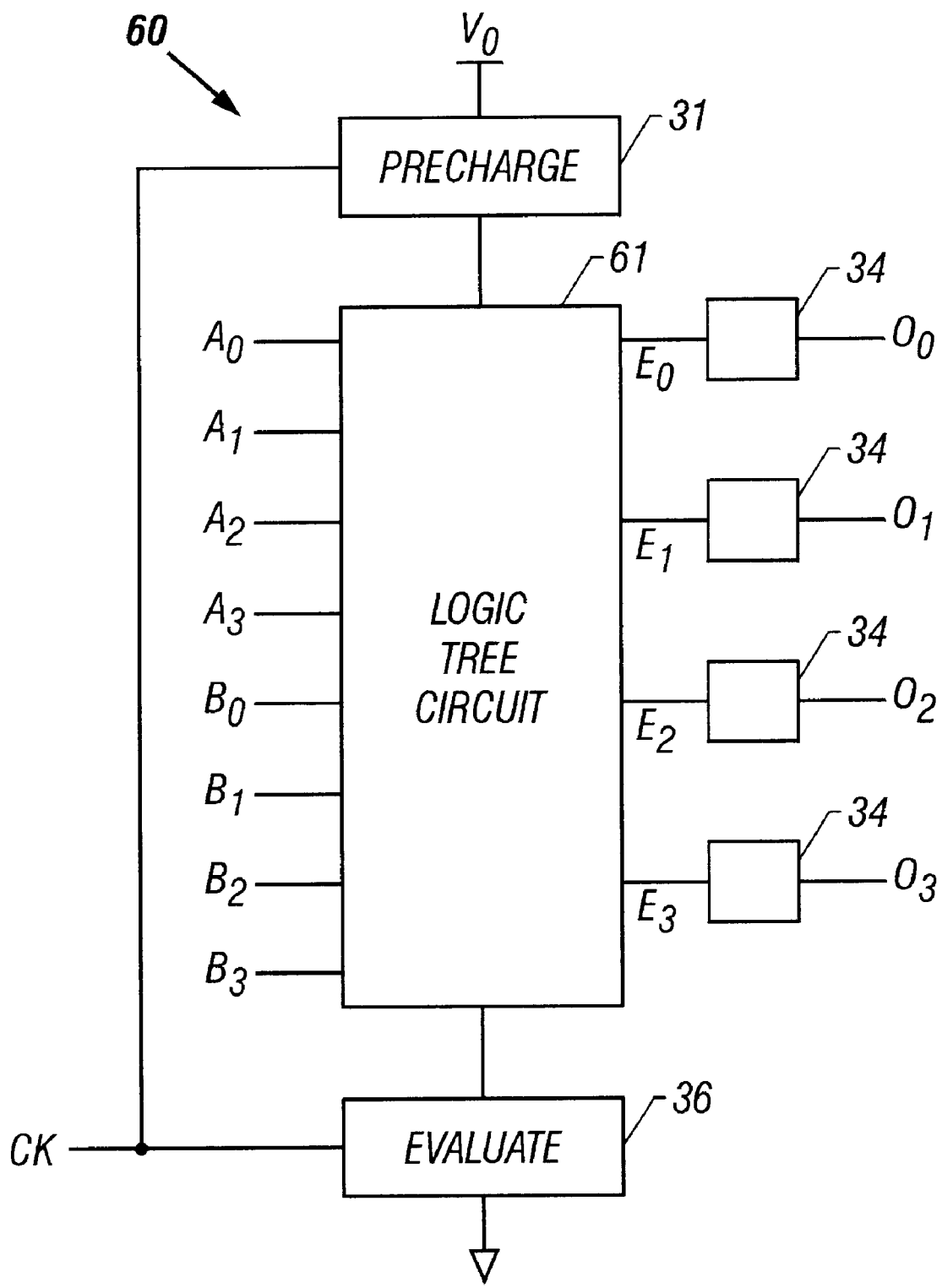
FIG. 2 is a 1-of-N logic gate

N-NARY logic may be used to create subcircuits, sometimes called "gates" or "cells" in this disclosure, to perform a desired function. FIG. 2 illustrates a 1-of-N logic gate 60 that uses two sets of 1-of-N signals, A and B, for the inputs and produces one 1-of-N signal, O, for the output. In gate 60, the A and B inputs comprise four wires each, with each set of wires representing 2 bits (one dit) of data. A is a one-dit input, B is a one-dit input, and O is a one-dit output. In other words, the gate 60 depicted in FIG. 2 comprises 4 input bits (2 dits) and 2 output bits (one dit).

Figure 3:
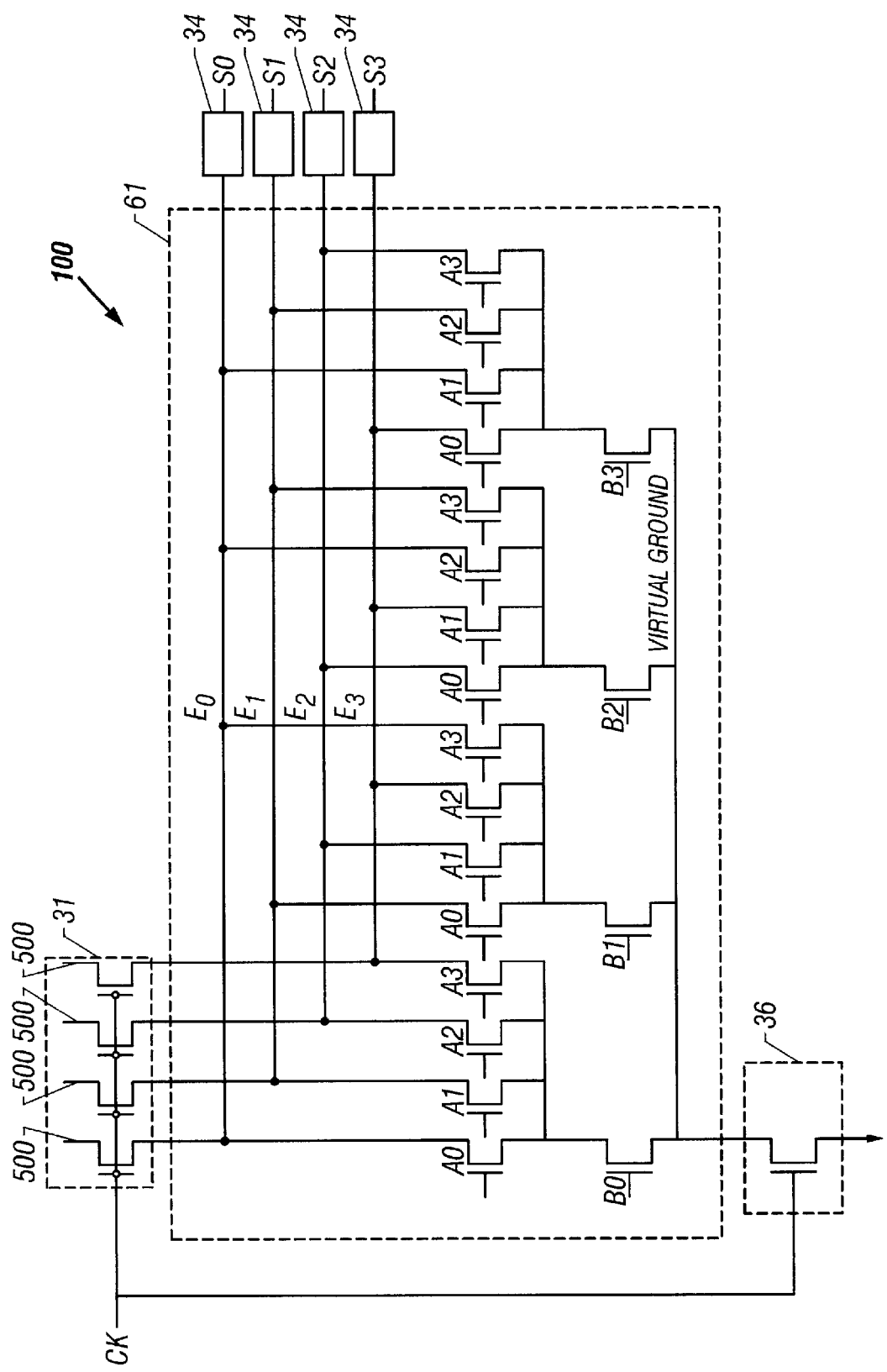
FIG. 3 is a 1-of-N adder logic gate showing the n-tree arrangement of transistors.

Referring to FIG. 2, each N-NARY logic circuit 60 comprises a logic tree circuit 61 (sometimes referred to hereinafter as an "N-tree,"), a pre-charge circuit 31, and an evaluate circuit 36. The logic tree circuit 61 performs a logic function on the two 1-of-4 input signals that could comprise a variety of functions, for example, the Boolean logic functions AND/NAND and OR/NOR, or more complex arithmetic or logical functions. The logic gates of the N-NARY family are clocked pre-charge (CP) gates. FIG. 3 illustrates that each input into the logic tree circuit 61 $A_0$–$A_3$, $B_0$–$B_3$ is coupled to at least one N-channel field effect transistor (NFET) $A_0$–$A_3$, $B_0$–$B_3$. Referring back to FIG. 2, the logic tree circuit 61 therefore comprises one or more N-channel FETS. Coupled to the wires of the 1-of-4 output signal are the output buffers 34 that aid in driving additional circuits that couple to the output signal. The preferred embodiment of the present invention uses a circuit with an inverting function as the output buffer 34. The preferred embodiment of the present invention utilizes either static invertors or NAND gates to accomplish the inversion function of the output buffer.

Referring again to FIG. 2, a precharge circuit 31 couples to the logic tree circuit 61 and precharges the dynamic logic of the logic tree circuit 61. The precharge circuit 31 comprises one or more FETs with the preferred embodiment of the circuit comprising P-channel FETs (PFETs). Each evaluation path of the logic tree circuit 61 has its own precharge PFET, shown as 500 in FIG. 3. The PFETs 500 of the precharge circuit 31 quickly and fully precharge all of the dynamic logic in the logic tree circuit 61 during the precharge phase of the clock cycle.

FIG. 3 is a diagram of an N-NARY adder gate. In FIG. 3, the precharge PFETs 500 for each evaluation node E of the N-NARY circuit is connected to positive high voltage, Vcc, and is used to create conductive paths between the evaluation node E and Vcc. Each precharge PFET 500 is coupled to the pre-charge clock signal CK. When the pre-charge clock signal for any evaluate node has a low voltage, then there is a conductive path between Vcc and the evaluation node E through the pre-charge PFET 500. A low clock signal on CK will cause the NFETs in the logic tree circuit 61 to charge when using P-channel FETs in the precharge circuit 31.

An evaluate circuit 36 couples to the logic tree circuit 61 and controls the evaluation of the logic tree circuit 61. The evaluate circuit 36 comprises one or more FETs connected to the CK signal, with the preferred embodiment of the evaluate circuit comprising a single N-channel FET. The single NFET acts as an evaluation transistor that is used to control when the gate is sensitive to inputs, helps avoid races between other devices, and prevents excessive power consumption. During the precharge phase, the evaluate circuit 36 receives a low clock signal CK so that no path to Vss (ground) may exist through the NFET(s) of the logic tree circuit 61. During the evaluate phase, the evaluate circuit 36 receives a high clock signal CK. If the evaluate circuit comprises a single NFET as shown in FIG. 3, a high clock signal on CK will cause the FETs in the logic tree circuit 61 to evaluate (i.e., discharge through an "evaluation path"). In other words, when the clock signal is high, the evaluate circuit 36 evaluates the logic tree circuit 61.

An evaluate, E, which comprises the four wires $E_0$, $E_1$, $E_2$, and $E_3$, is the signal pathway between the logic tree circuit 61 and an output buffer 34. As stated earlier, each evaluation node wire $E_0$, $E_1$, $E_2$, and $E_3$ has its own precharge PFET. The signal on a particular wire, $E_0$, $E_1$, $E_2$, $E_3$ of the evaluate node E is high only when there is no connection to Vss through the logic tree circuit 61 NFET(s) associated with that particular wire. If the pre-charge signal is low at time 0 and there is no path to ground through the NFET(s) associated with an evaluate node E of the logic tree circuit 61, then the evaluate node wire E gets pulled to a high voltage. This is called the precharge phase of the gate and we may also say that the gate is in precharge mode. If the precharge signal switches to a high voltage at a later time, the evaluate node E will be floating but the charge left on it will leave the voltage high. This is called the evaluate phase of the gate, and we may also say that the gate is in evaluate mode. If input signals generate a high voltage for any NFET(s) in the logic tree circuit 61 such that a path to ground (Vcc) is created on any of the wires of the evaluate node E, then the charge on that wire of the evaluate node E will drain to ground, and the evaluate voltage on that wire will drop to Vss. If no such path exists, then the evaluate node E will remain at Vcc. When any gate, therefore, switches from precharge mode to evaluate mode, the evaluate node voltage is high, and it either stays high or goes low. Once the evaluate node voltage goes low during the evaluate phase, it cannot be driven high again until the next precharge phase.

Figure 4:
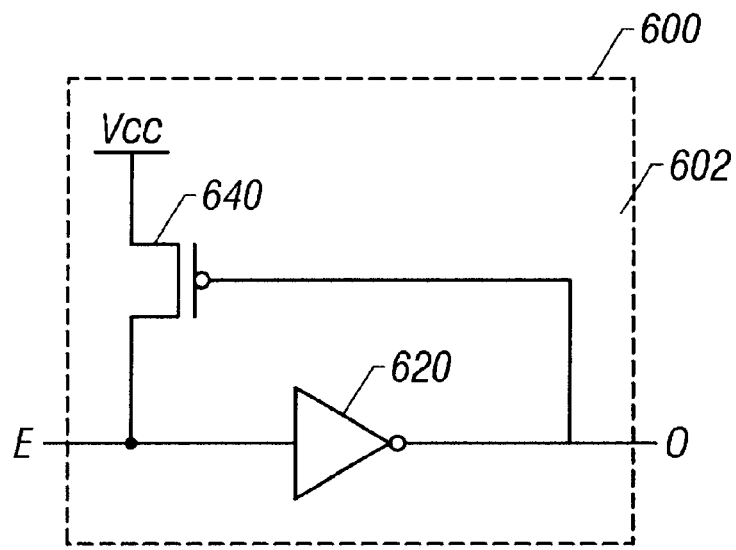
FIG. 4 shows a half-keeper output driver circuit that comprises an output buffer for a 1-of-N logic gate.
Figure 5:
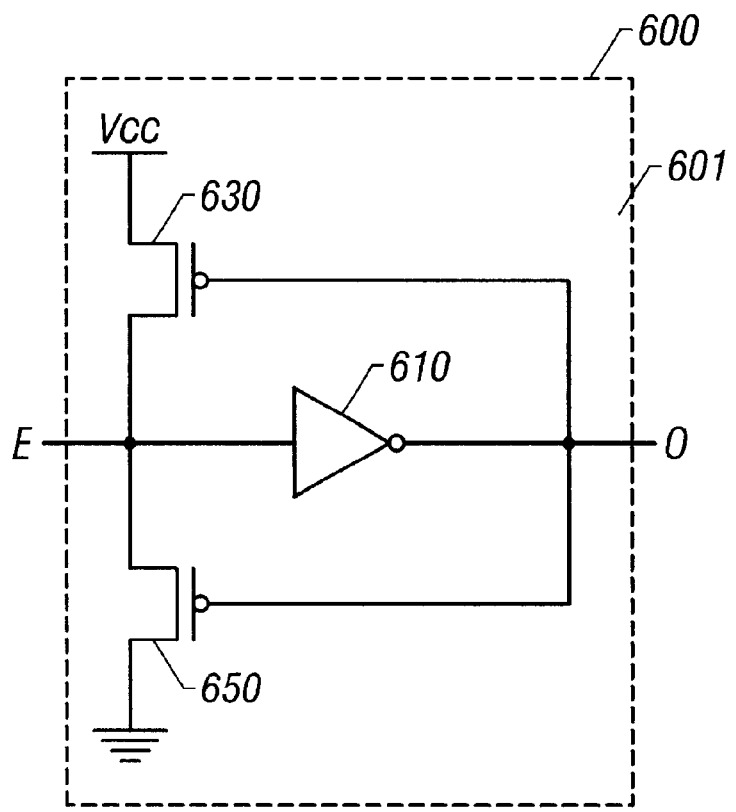
FIG. 5 shows a full keeper output driver circuit that comprises an output buffer for a 1-of-N logic gate.

Each evaluate node wire $E_0$, $E_1$, $E_2$, and $E_3$ couples to an output buffer 34. Two embodiments of the output driver circuit 600 comprising the output buffer 34 are illustrated in FIGS. 4 and 5. FIG. 4 illustrates a half keeper output driver circuit 602 that comprises an inverter 620 and a PFET device 640. FIG. 5 illustrates a full keeper output driver circuit 601 that comprises an inverter 610 coupled to a PFET device 630 and an NFET device 650. Full keeper circuits 601 are necessary for gates that can be in neither evaluate nor precharge mode for lengthy periods. The flow through the output driver circuit 600 is from evaluate node E to the output signal path O. The inverter 610, 620 of the output driver circuit 600 is necessary because the evaluate nodes of CP gates of the N-NARY logic family precharge to a high value and evaluate to a low value. The output driver circuit 600 of the output buffer 34 holds the value of an evaluate node E during an evaluate phase if the evaluate node E has not discharged. If the evaluate node E has discharged, then there is a path to ground holding its value low. The output of each evaluate node E will switch from low to high once, at most, during an evaluate phase. The output of each evaluate node E, once coupled to an output driver circuit 600 of an output buffer 34, is therefore suitable for feeding a subsequent CP gate.

Figure 6:
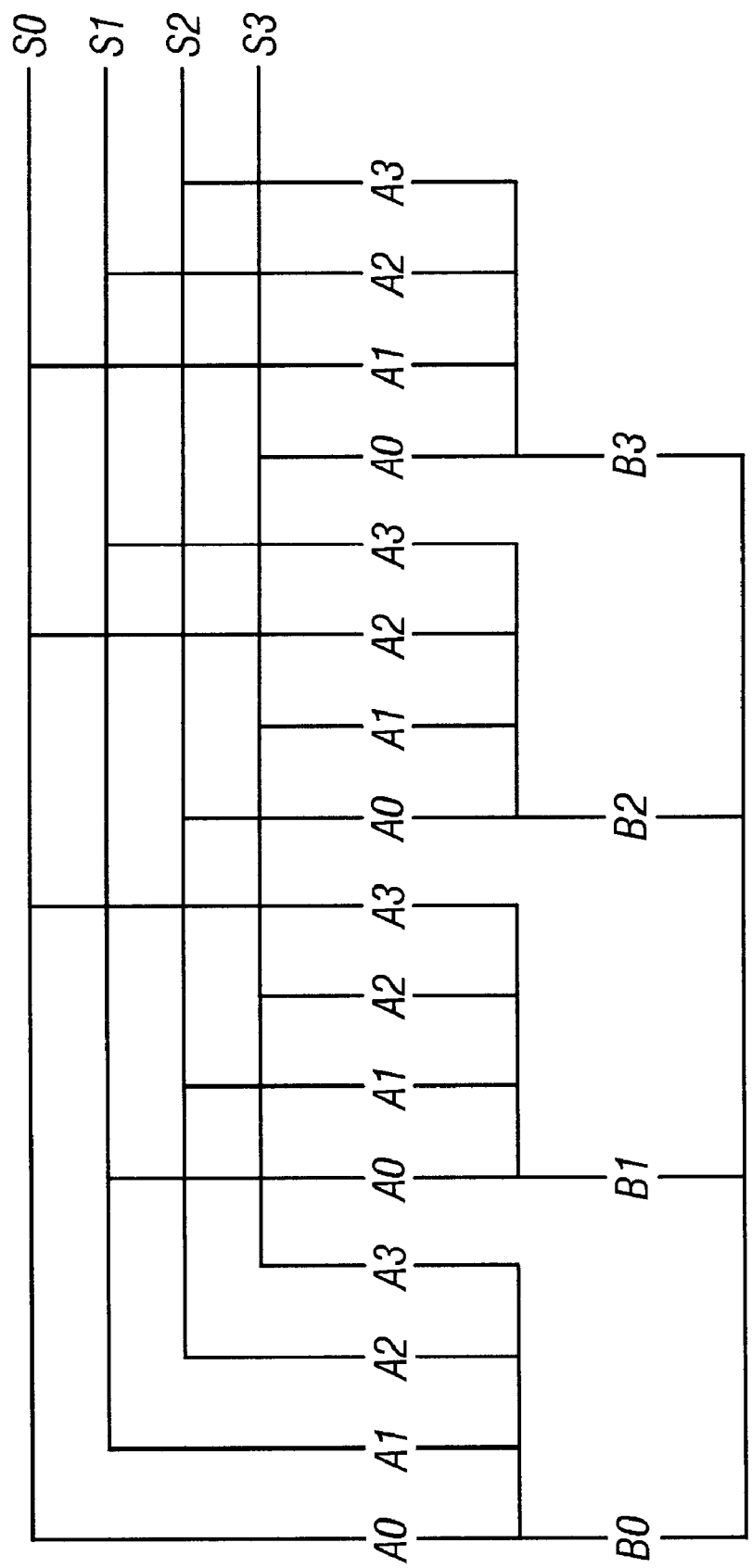
FIG. 6 is a shorthand representation of the adder gate shown in FIG. 3.

A shorthand notation for N-NARY circuit diagrams can be adopted to avoid needless repetition of elements common to all N-NARY circuits. FIG. 3 illustrates these common elements. One common element is the precharge P-FET 500. Precharge P-FETs 500 are required for each evaluate node E in every 1-of-N gate. Since all N-NARY gates require a pre-charge P-FET 500 for each evaluate node E, the precharge P-FETs 500 may be implied and need not be shown. The same is true for the N-FET associated with each input wire of the A and B inputs. Similarly, each evaluate node E must have its own output buffer 34, which may be implied. The N-FET associated with the evaluate node 36 may also be implied. Since these features are common to all N-NARY circuits, we may use the shorthand shown in FIG. 6 to represent the N-NARY circuits. Accordingly, FIG. 6 illustrates a shorthand notation of the adder gate depicted in FIG. 3. This shorthand notation is used in FIGS. 11–23. In some figures, a modified shorthand representation is used in which N-FETS associated with certain inputs are expressly represented, but all other elements discussed herein are implied. In each figure, the elements discussed herein should be implied accordingly.

Overview of Present Invention

Figure 1:
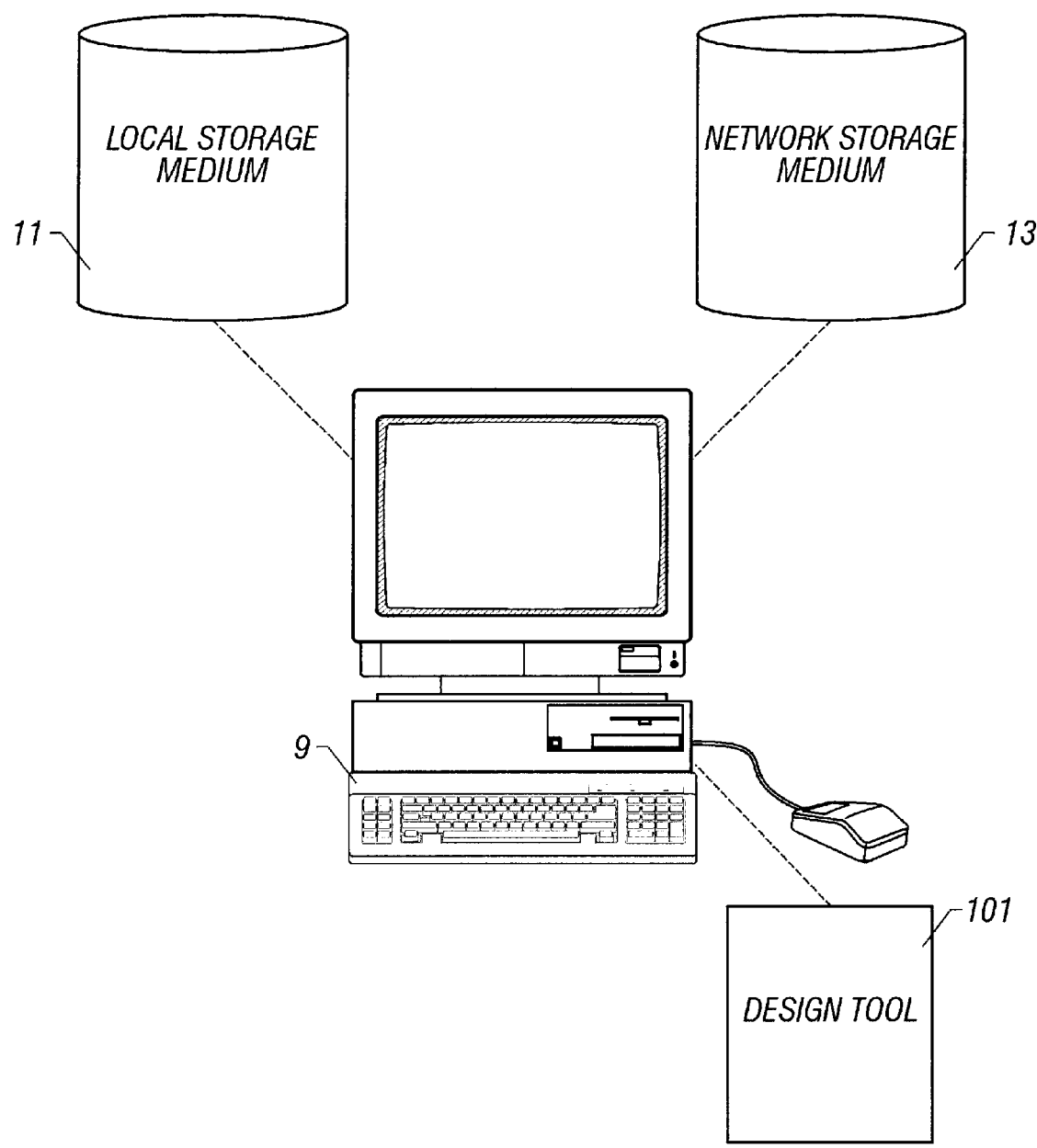
FIG. 1 is a block diagram showing the use of the semiconductor design tool of the present invention in connection with a computer and various computer storage media.

FIG. 1 illustrates the concept that the design tool 101 of the present invention operates with a computer 9 and comprises components that can be encoded on local computer storage media 11 or on network computer storage media 13, enabling the designer to utilize a computer 9 to practice the present invention 101.

Figure 1A:
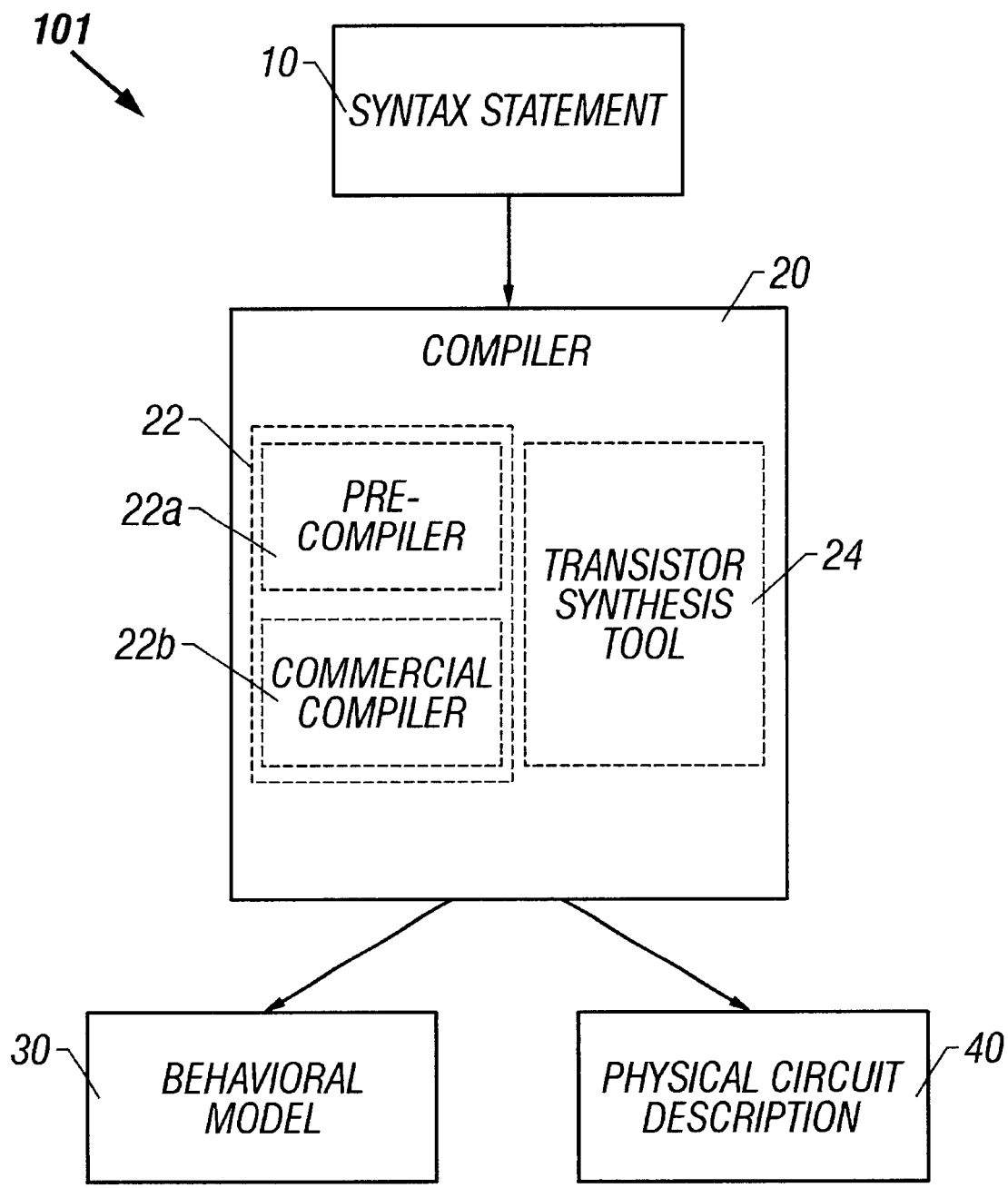
FIG. 1A is a block diagram of the semiconductor design tool of the present invention.

FIG. 1A is a block diagram of the present invention 101, illustrating that the compiler 20 of the present invention 101 generates both a behavioral model 30 and a physical circuit description 40 from a single syntax statement 10. This syntax statement 10 may be written or encoded in any programming language. In the preferred embodiment of the present invention, the syntax statement 10 is encoded in a combination of ANSI C and a novel modified subset of ANSI C, referred to herein as N-NARY C. Syntax statements 10 describe, in an easily compilable way, both the logical function implemented by the subcircuit being designed and the specific configuration of transistors required to build said circuit. This novel dual-function feature is a key advantage of the present invention over the prior art.

FIG. 1A illustrates that, in addition to the syntax statement 10, the present invention 101 comprises a compiler 20 that processes and decodes the syntax statement 10 to generate both the behavioral model 30 and its corresponding physical circuit description 40. The compiler 20 of the present invention comprises three separate compiler components. As shown in FIG. 1A, one component of the compiler 20 is the transistor synthesis tool 24. The transistor synthesis tool 24 generates the physical circuit description 40 for the subcircuit described in the syntax statement 10. As shown in FIG. 1A, a second component of the compiler 20 is a make-model pre-compiler 22A. The make-model pre-compiler 22A sends information to the third component, a commercial C language compiler 22B, as well as to the transistor synthesis tool 24. In the preferred embodiment, the commercial compiler 22B comprises a commercially available C language compiler known as "gcc." The make-model pre-compiler 22A and the commercial compiler 22B are sometimes together referred to herein as the make-model component 22. The make-model component 22 is responsible for generating the behavioral model 30.

Regarding the physical circuit description 40 that is generated from the syntax statement 10, any hardware design language often contain areas of ambiguity in terms of translating logical syntax statements into a particular configuration of transistors that perform the function. For instance, it is not inherent in the syntax of most hardware design languages exactly how the transistors should be placed within a gate that implements the logic function "bitwise AND." Nor is it inherent in syntax whether a multiplexer function should or will be implemented in a top-select or bottom-select transistor configuration. Some other important physical gate characteristics that need to be considered when designing a gate include capacitance isolation, shared internal nodes, and the use of complex output drivers.

The goal of the N-NARY hardware design language is to, with a single statement, describe both the behavior of the circuit (in a form suitable for fast cycle-based simulation), and a specific physical structure of the circuit, where multiple physical transistor arrangements could each implement the same logical circuit behavior. In order to meet the first requirement, we use a novel subset of C syntax referred to herein as "N-NARY C." Commercially available C compilers, such as gcc, may be used to compile N-NARY C. The specific physical structure of the gate under design is also derived from the single N-NARY C statement by overloading the meaning of several C operators, as is explained below in connection with the gate expression syntax of the present invention.

The syntax statement 10 illustrated in FIG. 1A comprises one or more "gate instantiations." A "gate instantiation" contains information regarding the inputs, outputs, and logical function of a particular gate under design. However, because these elements can only be described in the syntax statement 10 in terms of signal names and characteristics, a thorough understanding of the signal naming convention used in N-NARY C is a prerequisite to understanding the gate instantiation syntax that governs the development of the syntax statement 10 of the present invention.

N-NARY C Signal Naming Convention

In order for the present invention to create one, and only one, possible configuration of transistors for each cell, an important aspect of N-NARY C is a rigid signal naming convention. This signal naming convention serves as a useful documentation aid and, more importantly, provides additional information to the make-model component 22 and to the transistor synthesis tool 24.

Figure 7:
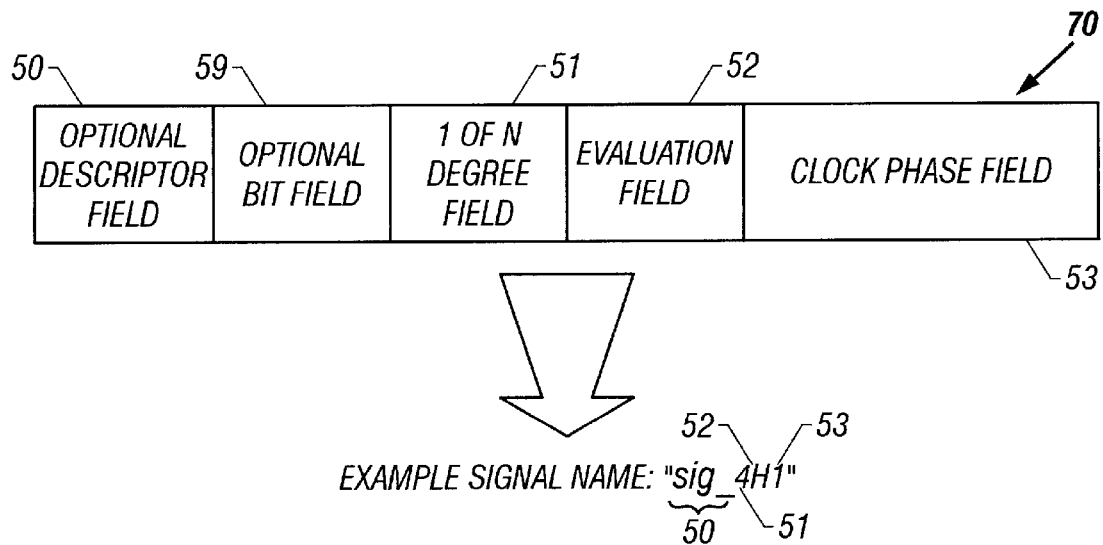
FIG. 7 shows the arrangement of fields that comprise a N-NARY C signal name of the present invention.

The signal naming convention imparts to the make-model component 22 and transistor synthesis tool 24, hereinafter collectively referred to as "the compiler components," various categories of information regarding gate input signals and gate output signals. This information comprises information concerning 1-of-N degree, evaluation, and clock phase. FIG. 7 depicts the various fields within an N-NARY C signal name 70. FIG. 7 illustrates that each signal name 70 comprises a 1-of-N degree field 51, an evaluation field 52, a clock phase field 53, and may also comprise an optional descriptor field 50 and an optional bit field 59.

The 1-of-N degree field 51 illustrated in FIG. 7 is an integer greater than or equal to 2. While the N-NARY logic design style does not impose a fixed maximum value for 1-of-N degree, the preferred embodiment of the present invention imposes a practical limit of 16 for the 1-of-N degree field.

The evaluation field 52 of the N-NARY C signal name 70 comprises the characters H, h, L, and l. These characters indicate whether the gate driving the signal evaluates with a rising or falling voltage. The characters "H" and "h" in the evaluation field 52 indicate evaluation on the rising edge. The characters "L" and "l" in the evaluation field 52 indicate evaluation on the falling edge. Signals that evaluate on the rising edge are called high-going signals. Signals that evaluate on the falling edge are called low-going signals. This signal convention allows the transistor synthesis tool 24 to ensure that only high-going signals are used for connections between gates. The transistor synthesis tool 24 uses low-going signals internally within cells. Use of high-going and low-going signals between and inside circuit cells is further described in the discussion below relating to the specific information coded within the syntax statement 10.

The use of the upper- and lower-case of H and L in the evaluation field 52 designates the "evaluation completeness" of the named signal. To understand "evaluation completeness," a background discussion of N-NARY signal characteristics may be helpful. A 1-of-N signal is a signal driven by a cell which evaluates for all possible legal combinations of input. The 1-of-N signal will, if it fails to evaluate, represent an invalid state. A 0-or-1-of-N signal is a signal driven by a cell which fails to evaluate for some legal input value. The 0-or-1-of-N signal will, if it fails to evaluate, represent a null value. This stems from the fact that, even for a value of zero, a 1-of-N signal must assert a positive voltage on one, and only one, wire of the N potential wires. Failure of a 0-or-1-of-N signal to assert a wire during an evaluation clock phase therefore results in a null value, rather than a value of zero. In the preferred embodiment of N-NARY C, 1-of-N signals are indicated by the upper-case characters H and L in the evaluation field; 0-or-1-of-N signals are indicated by the lower-case characters h and l in the evaluation field.

In addition to the evaluation field and the 1-of-N degree, an complete N-NARY C signal name includes information regarding the evaluation clock phase of a signal. This information, denoted as the clock phase field 53 in FIG. 7, indicates the clock phase during which evaluation of the cell driving the signal evaluates. The minimum valid value for phase is 0 and the maximum is: M−1, where M is the highest number of clock phases available to the circuit under design. The number of valid clock phases is a design specific variable but is usually between 3 and 6.

To summarize the N-NARY C naming convention thus far, the naming convention is calculated to identify certain specific information that characterizes the signal. The naming convention indicates the 1-of-N degree for each gate signal in the value of the 1-of-N degree field 51 for the signal name 70. The character within the evaluation field 52 conveys information concerning the evaluation direction and evaluation completeness of the signal. The value of the clock phase field 53 delivers information regarding the clock phase in which the signal evaluates. FIG. 7 illustrates that, in addition to the fields 51, 52, 53 mentioned above, N-NARY C also allows certain other optional information to be included in the name of a signal 70. This optional information includes a description of the signal, referred to in FIG. 7 as the descriptor field 50, and bit number information, labeled in FIG. 7 as the bit field 59. In the preferred embodiment, the signal description is set forth in the descriptor field 50 and may comprise any number of lower-case alphanumeric characters, including the under-score "_" character. For example, a signal may be validly described in the descriptor field 50 as "sig1_" or "int2_".

Figure 8:
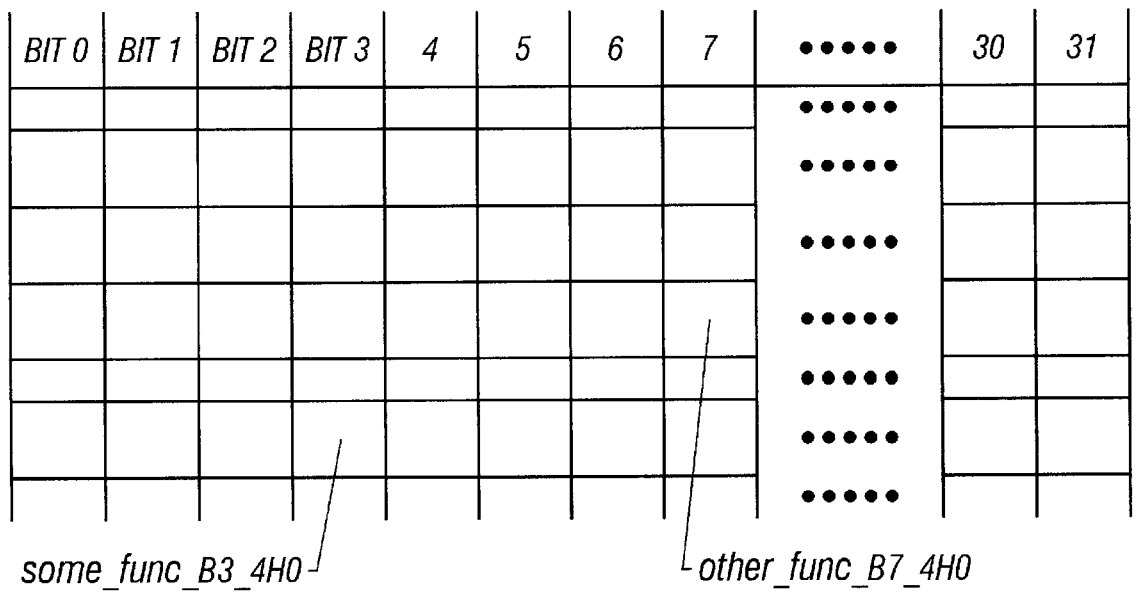
FIG. 8 shows a "floorplan" of gates, wherein related gates are organized into bit columns.

The contents of the bit field 59 specify the bit column to which the gate being constructed belongs. In general, in a data flow design, all the gates that operate on a given bit of data (e.g., "bit 4") are "floorplanned" such that the gates line up in a column (a "bit column"), facilitating orderly operation of the gates. The "floorplan" thus contains columns of related gates, as shown in FIG. 8.

Gate Instantiation Syntax

Figure 9:
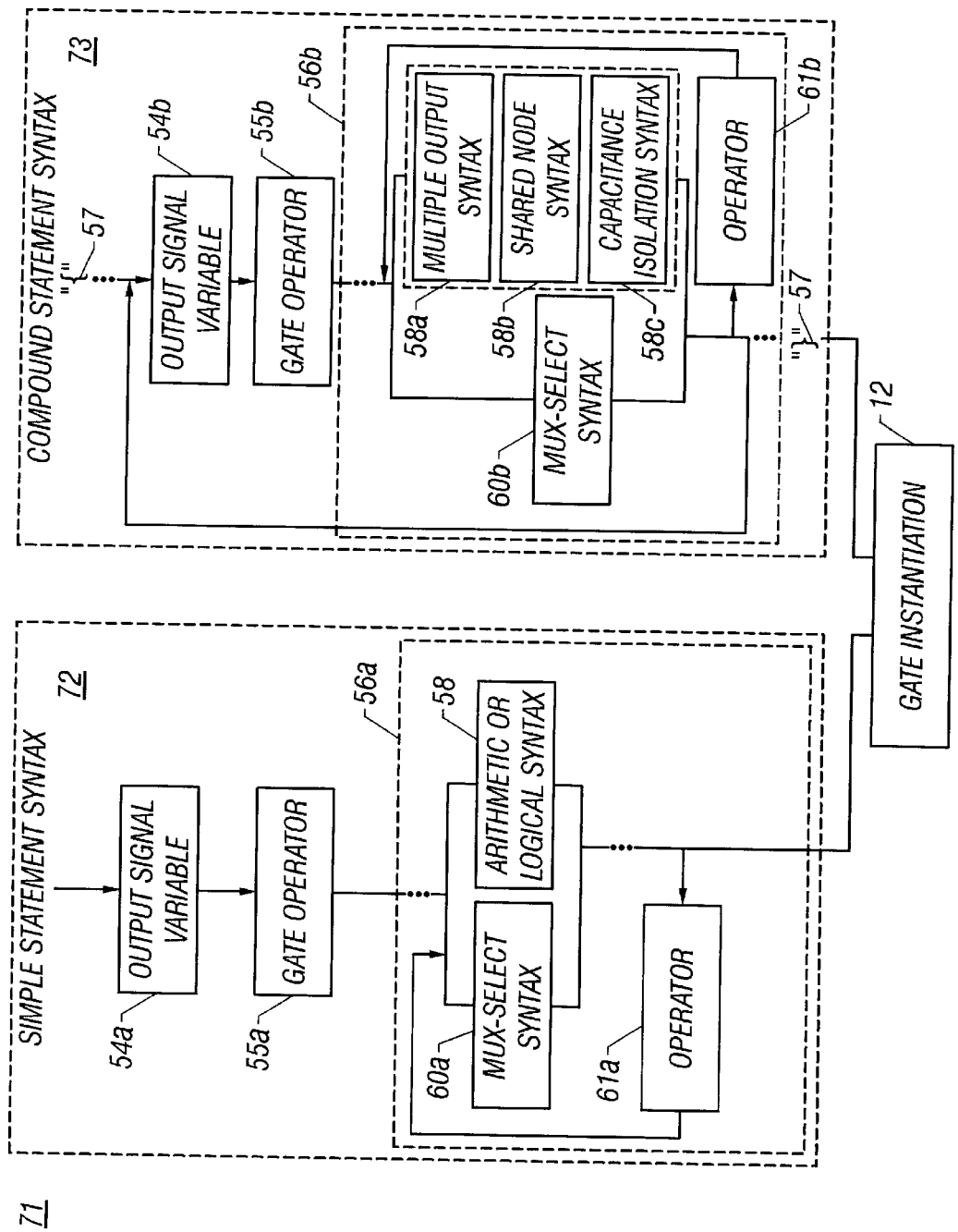
FIG. 9 shows the gate instantiation syntax governing construction of the gate instantiation statement of the present invention.
Figure 9A:
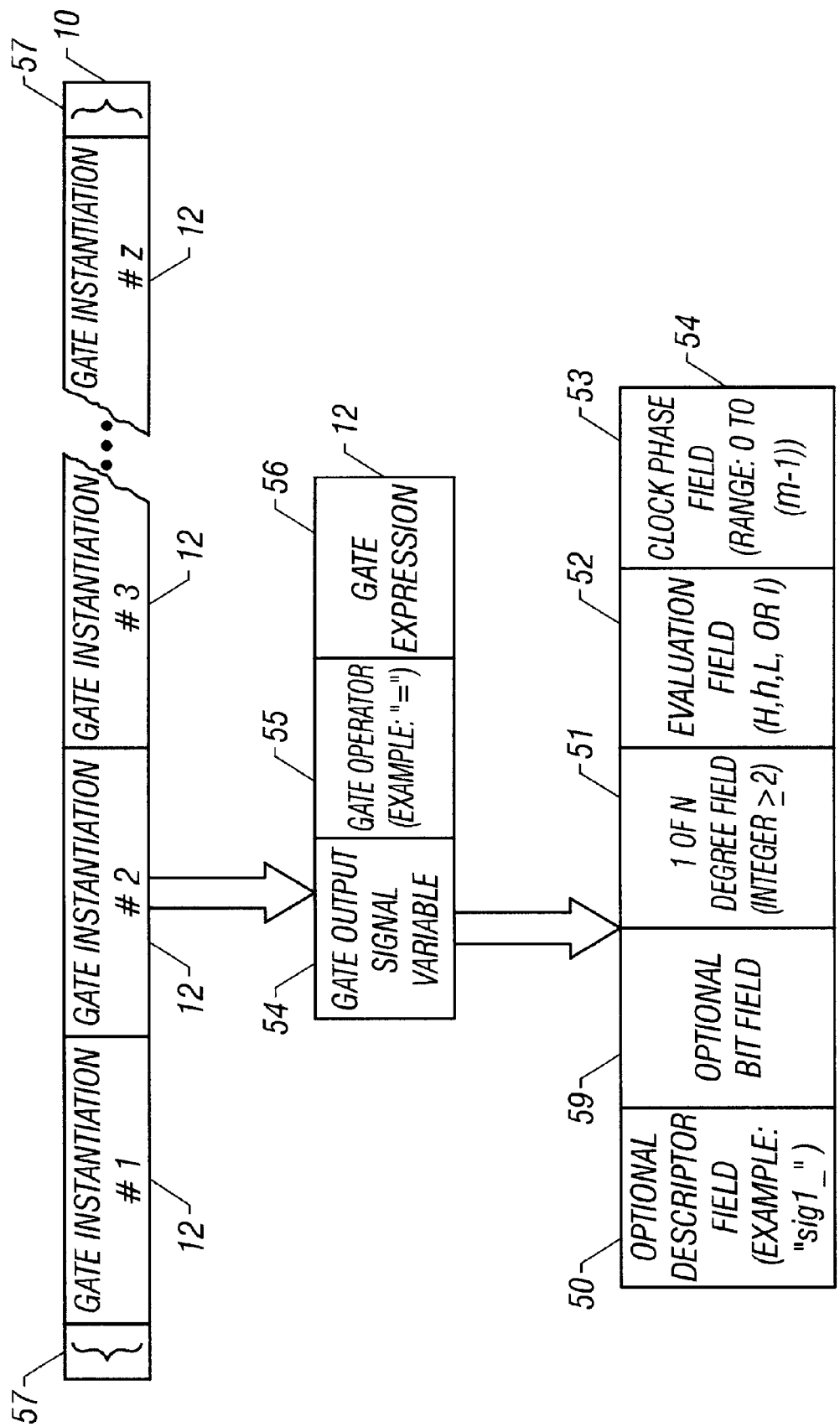
FIG. 9A depicts the physical arrangement of the gate instantiation statement within the syntax statement of the present invention.

As described above, the syntax statement 10 illustrated in FIG. 1A comprises one or more "gate instantiations," which contain information regarding the inputs, outputs, and logical function of the gate under design. The structure of each gate instantiation is controlled by a gate instantiation syntax 71, which is shown in FIG. 9. FIG. 9A shows an exemplary syntax statement 10 comprising a number of gate instantiations 12. FIG. 9A also shows various components of the gate instantiation 12 that are governed by the gate instantiation syntax 71. FIG. 9A is provided for illustration only, and is not intended to imply or describe any limitation of the present invention to the gate instantiation component fields or values shown.

As shown in FIGS. 9 and 9A, the gate instantiation syntax 71 requires that every gate instantiation 12 include one or more gate output signal variables (54a and 54b in FIG. 9; 54 in FIG. 9A), one or more gate operators (55a and 55b in FIG. 9; 55 in FIG. 9A), and one or more gate expressions (56a and 56b in FIG. 9; 56 in FIG. 9A). Gate instantiations that contain only one gate output signal variable 54a and one gate operator 55a are considered to be simple statements, governed by the simple statement syntax 72 shown in FIG. 9 and excluding the "curly braces" compound statement indicator 57. On the other hand, gate instantiations that contain more than one gate output signal variable 54b and/or more than one gate operator 55b, and/or certain optional design control features are considered to be compound statements, governed by the compound statement syntax 73 shown in FIG. 9. As described more fully below, the compound statement syntax 73 includes the "curly braces" compound statement indicator 57, and provides designers with greater capability to control the number of output signals in the physical implementation of the gate under design, as well as control the use of output drivers to isolate capacitance and reduce the size of the gate through the use of shared evaluate nodes.

Figure 9B:
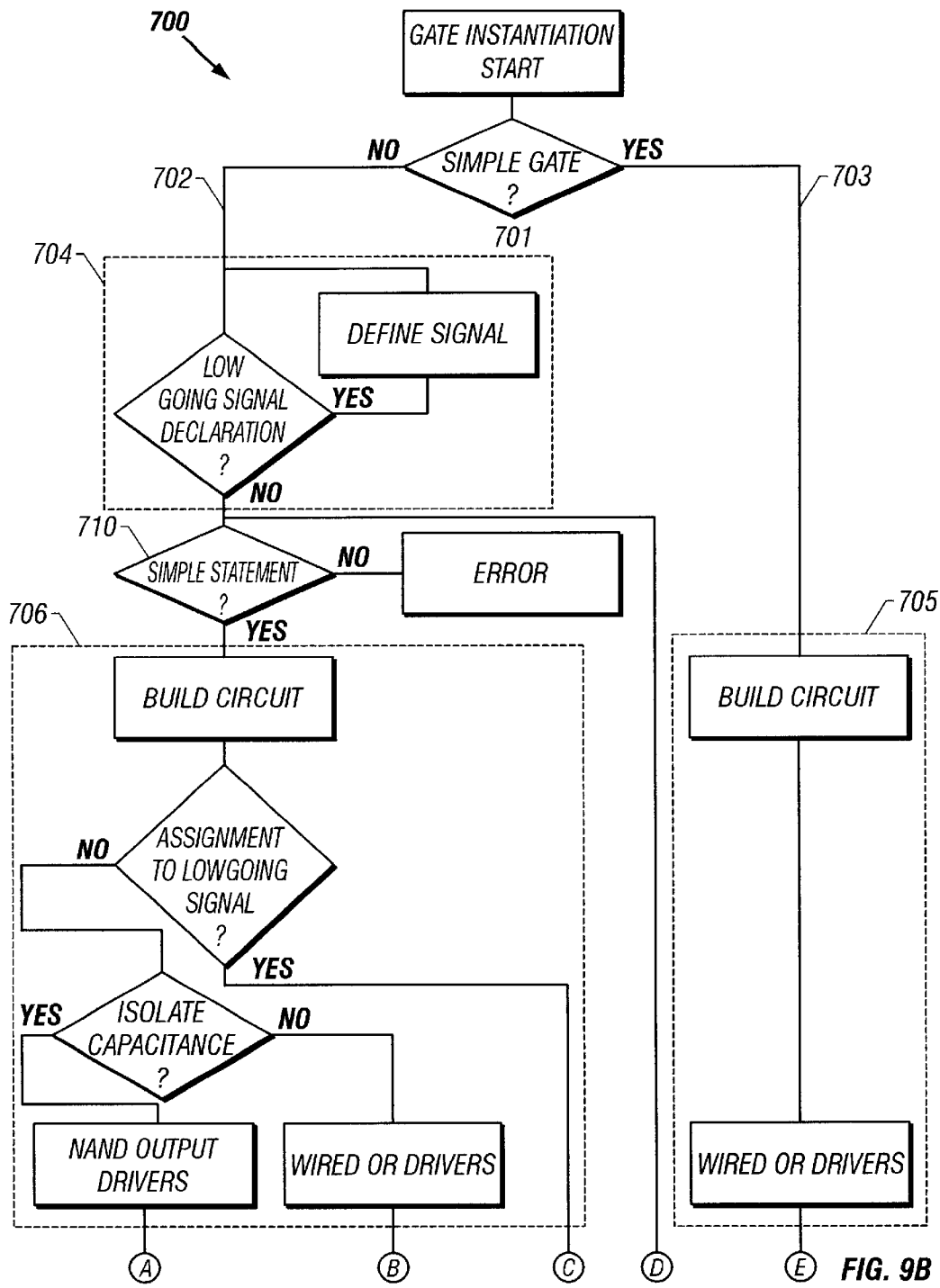
FIGS. 9B and 9C show the gate instantiation process.
Figure 9C:
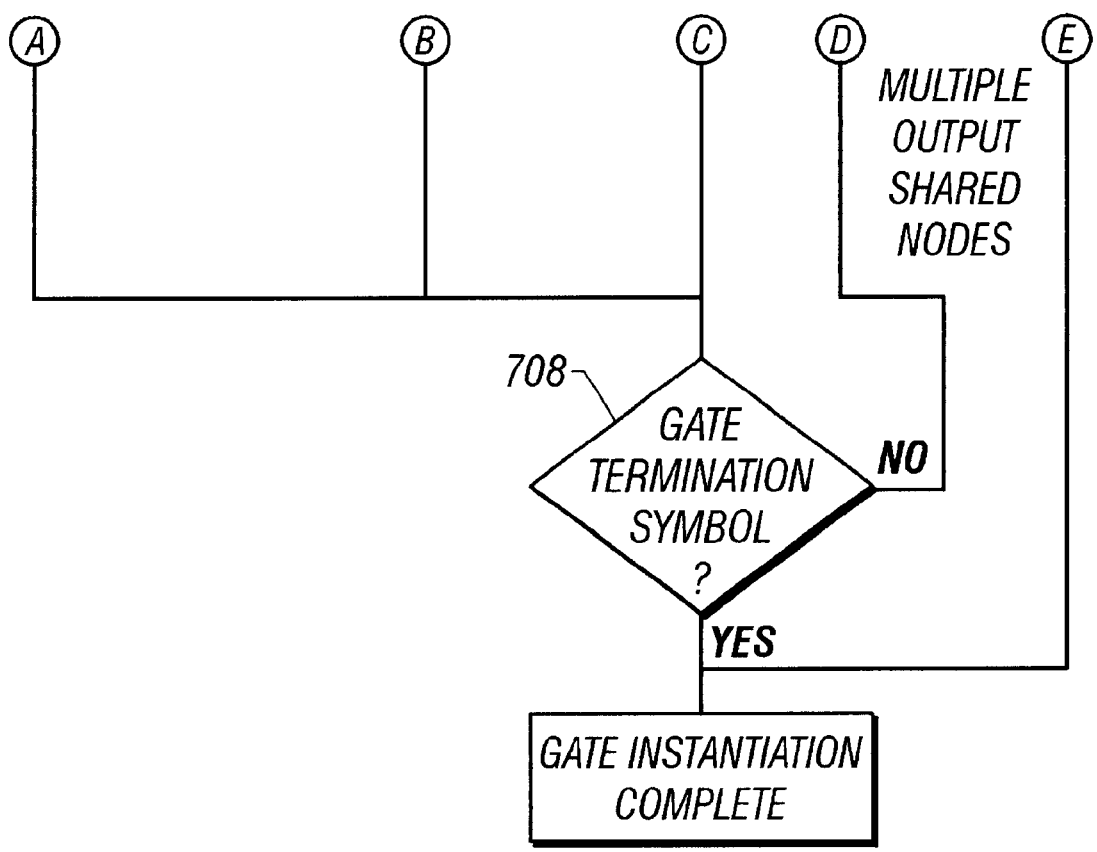

FIG. 9B shows the gate instantiation process 700. The gate instantiation process 700 interprets and decodes the syntax statement 10 in accordance with the gate instantiation syntax 71 to create the physical circuit description 40. The process begins by segregating simple statements from compound statements, at 701, according to the "curly braces" designator for compound statements 57. The process for simple statements follows the path to the right hand side of FIG. 9B, designated 703, wherein the circuit is built according to the simple gate expression 56a, at 705.

The process for compound statements follows the path on the left hand side of FIG. 9B, designated 702 in FIG. 9B. At 704, the signals in the output signal variable 54b and in the gate expression 56b are identified. At 706, the circuit is built for each expression within the gate expression 56b, according to the compound statement syntaxes 58a, 58b, 58c, and 60b. Blocks 708 and 710 provide for internal checking for the compound statement "curly brace" designator 57. When a designator 57 is encountered at 708, the process ends and the gate instantiation is complete. If a designator 57 is not encountered at 708, the build process 706 repeats for the next expression within the compound gate expression 56b, after internal checking for errors at 710.

Each of the fields within the gate instantiation statement 12 is further discussed below, along with the syntax governing each field and the meaning of the characters that appear within the various fields.

Gate Output Signal Variable

In general, the gate output signal variable (54a and 54b in FIG. 9; 54 in FIG. 9A) identifies the output signal(s) of the gate. The exception to this general rule occurs when a gate output also appears as a signal variable within the gate expression 56; this exception will be described in more detail in the gate expression discussion below. In accordance with the N-NARY C signal naming convention discussed above, the output signal variable 54 identifies the 1-of-N degree of the output signal (51 in FIG. 9A), its evaluation information (52 in FIG. 9A), and its evaluation clock phase (53 in FIG. 9A). In addition, the output signal variable 54 may include a signal name in the optional descriptor field 50 and a bit in the optional bit field 59, both in accordance with the N-NARY C signal naming convention. In the preferred embodiment, the gate output signal variable 54 is situated on the left-hand side of the gate operator 55 and is defined as a high-going signal.

Gate Operator

The gate operator 55 indicates to the make-model component 22 and the transistor synthesis tool 24 that a gate is being expressed. In the preferred embodiment of the present invention, the gate operator 55 is a single equal sign ("=") located between the gate output signal variable 54 and the gate expression 56. In the preferred embodiment, the single= gate operator 55 indicates that the gate output variable 54 is assigned to the result of the gate expression 56.

Gate Expression

In addition to a gate operator 55 and a gate output signal variable 54a, 54b, a syntax statement 10 must indicate to the compiler components 22, 24 the logical function of the gate under design. In the preferred embodiment, the gate instantiation 12 performs this task through the portion of the gate instantiation 12 called the gate expression 56. The gate expression 56 comprises everything to the right of the gate indicator 55 in the gate instantiation 12 and provides information concerning the logical function and the structure of the gate under design. The required syntax for the gate expression component of the gate instantiation 12 is discussed in more detail below.

As discussed above, the syntax statement 10 for a gate may comprise one or more gate instantiations 12. Likewise, each gate instantiation 12 within a syntax statement may comprise a single gate expression statement, or multiple gate expression statements. In order to identify a set of gate expression statements as belonging to a single gate construction, the C-syntax for blocks of code is used: '{' and '}' 57. Anything between a set of "curly braces" 57 forms a single gate. In the preferred embodiment, if a high-going gate output signal 54 is assigned (using the single '=' gate operator 55) to the result of a gate expression 56 consisting of only other high-going signals, then it is assumed that a single statement gate expression is being described according to the simple statement syntax 72. This assumption allows the curly braces 57 to be omitted in simple statements.

Gate Expression Syntax

The gate expression 56 for a gate instantiation 12 not only describes the logical function of a logic gate, but also allows the user significant control, through the use of specific syntax, over the ultimate physical configuration of the logic gate under design. The gate expression syntax 56 uses three classes of operators to indicate to the transistor synthesis tool 24 how the n-tree of an N-NARY logic gate should be constructed. These classes of operators comprise: 1) relational operators between a signal and a value; 2) the bitwise OR operator ("|"); and 3) the multiplication operator ("*").

In general, relational operators operate to pick a value from an N-NARY signal and use that value to control an n-channel device in the n-tree. Thus, for instance, the expression: (sig_4H0==0) connects the wire representing the zero value of the 1-of-4 N-NARY signal described as "sig_" to the gate of an n-channel device in the n-tree (see FIG. 10A). Similarly, the expression: (sig_4H0!=0) connects three n-channel devices in parallel (with their sources and drains connected) with their gates connected to the wires of signal sig_4H0 representing decimal values 1, 2, and 3, respectively (See FIG. 10B).

The logical OR operator '||' may be used to combine relational operators. For instance, use of the logical OR operator renders the following two equations logically equivalent:

$$((\text{sig\_4}H0==1)||(\text{sig\_4}H0==2)||(\text{sig\_4}H0==3)) \quad \text{(Equ. 1)}$$

$$(\text{sig\_4}H0!=0) \quad \text{(Equ. 2)}$$

The transistor configuration described in Equ. 1 is illustrated in FIG. 10A, while the transistor configuration described in Equ. 2 is illustrated in FIG. 10B.

The bitwise OR operator '|' is used in the syntax statement 10 to describe a gate whose transistors are at the same level of an n-tree. This is similar in concept to the use of the logical OR operator, described above, except that the n-channel devices' drains are not connected. The '|' operator must be used in conjunction with the '*' operator.

The '*' operator is used in the syntax statement 10 to describe one of two different aspects of a gate. It is either used to assign a name (or value) to a wire, or it is used to indicate to the transistor synthesis tool 24 that a new level should be generated in an n-stack. (The terms "n-stack" and "stack height" refer to the number of transistors between an evaluation node and virtual ground.) For instance, a gate expression of ((sig_4H0==0)*0) indicates that a logic gate is desired wherein the wire of signal sig_4H0 that represents zero is connected to a gate of an n-channel device within the logic gate and is assigned a value of zero to its drain. A physical gate description 40 of such gate expression is illustrated in FIG. 10C. Note that this is equivalent to writing (0*(sig_4H0==0)). Likewise, the gate expression: (0*(sig1_2H0==0)|(1*(sig1_2H0==1) forms two n-channel devices in parallel, except that instead of being connected to each other, the drains for the two devices are assigned a name of 0 and 1, respectively. The physical circuit description generated by such gate expression is illustrated in FIG. 10D.

Figure 10E:
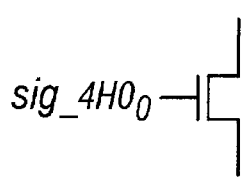
FIG. 10E depicts the transistor arrangement described by the gate expression ((sig2_4H0=0)*((0*(sig1_2H0=0))|(1*(sig1_2H0=1)))).
Figure 10E:
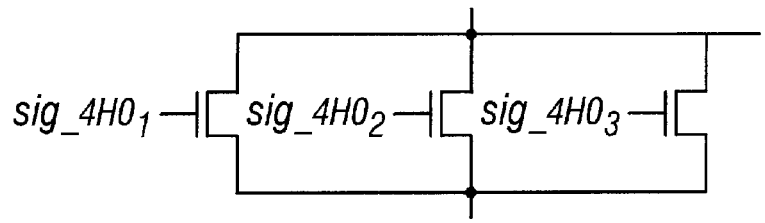
Figure 10E:
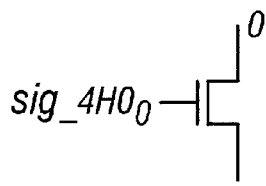
Figure 10E:
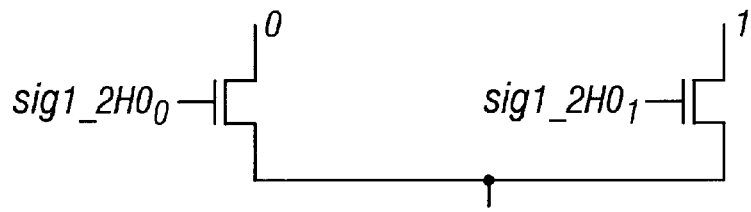
Figure 10E:
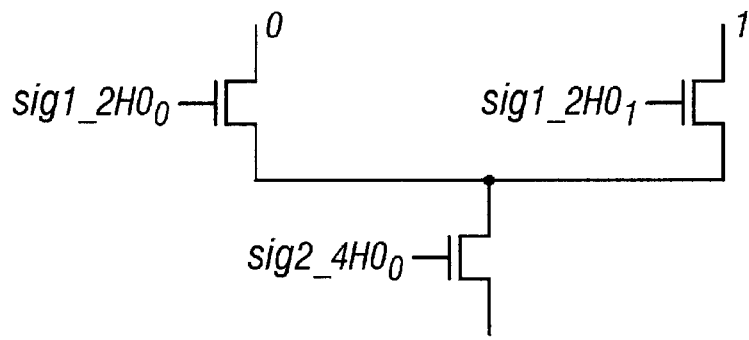
Figure 10F:
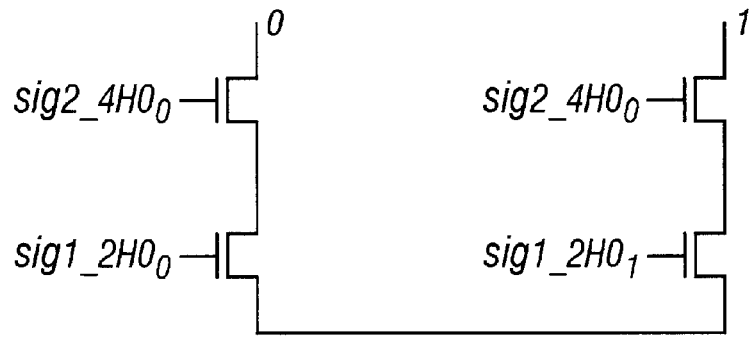
FIG. 10F depicts the transistor arrangement described by the gate expression (((0*(sig1_2H0=0))|(1*(sig1_2H0=1)))*(sig2_4H0=0)).

Having set forth the previous example, the other use of the "*" operator can now also be shown. The gate expression: ((sig2_4H0==0)*((0*(sig1_2H0==0))|(1*(sig1_2H0==1)))), describes a gate with a 2-high n-stack, as illustrated in FIG. 10E. The drains of the transistors in the first level of the n-tree are connected to the sources of the transistors in another level. One should also not that the left operand of the '*' operator is on the bottom of the n-stack, while the right operand is above it. Thus, the following gate expression results in a different physical circuit description, illustrated in FIG. 10F, than that for the gate expression set forth earlier in this paragraph: (((0*(sig1_2H0==0))|(1*(sig1_2H0==1)))*(sig2_4H0==0)). In the latter case, FIG. 10F illustrates that the '*' operation distributes over the '|' operation. In contrast, that is not true with the former gate expression set forth in this paragraph. The physical circuit descriptions illustrated in FIGS. 10E and 10F, which implement the former and latter gate expressions set forth in this paragraph, respectively, implement the same logical function. However, the transistor placements are different in FIGS. 10E and 10F due simply to syntactical differences in the respective gate expressions. In fact, the transistor configuration illustrated in FIG. 10F is also described by the following gate expression: ((0*(sig1__2H0==0)*(sig2__4H0==0))|(1*(sig1__2H0==1)*(sig2__4H0==0))).

The operator used in the gate expression 56 may comprise one of a plurality of possible operators, with the plurality comprising all operators defined in ANSI C and any other programming language, including, but not limited to, arithmetic operators, relational and equality operators, and logical operators. These types of expressions are governed by standard programming arithmetic or logical syntax rules, shown within the simple statement syntax 77 in FIG. 9 as reference 58. In fact, although this syntax is not pictured within the compound statement syntax 73 shown in FIG. 9, these types of expressions can be included within compound statements. In addition, as shown in the equations above, for any gate expression 56 comprising more than one expression, such multiple expressions will be separated by at least one additional operator 61 (shown as 61a and 61b on FIG. 9).

The gate expression 56 may also comprise any grouping construct permitted by any programming language, including parenthesis and brackets. As discussed both above and below, the preferred embodiment of the present invention 101 gives the "{ . . . }" ("curly braces" 57) grouping construct a specialized meaning in connection with the compound statement gate expression 56b.

The gate expression 56 for a gate instantiation 12 does more than describe the logical function of a gate via equations of the sort included in the preceding discussion. In addition, the gate expression 56 allows the user significant control, through the use of specific syntax, over the ultimate physical configuration of the gate under design. For instance, by using a particular syntax pattern in N-NARY C, called the mux-select syntax 60a, 60b, a user may exhibit control over whether a mux gate is implemented at the transistor level as a top-select or bottom-select mux.

In addition to the mux-select syntax 60a, 60b, a compound statement gate expression 56b may also comprise expressions that conform to one of three additional syntaxes: a multiple output syntax 58A, which allows the user to define multiple outputs from a single gate; a capacitance isolation syntax 58C, which allows a user to describe a circuit that uses NAND gates rather than simple invertors in the output driver circuit, labeled as 600 in FIGS. 4 and 5; and a shared node syntax 58B, which allows the user to describe an optimized gate that shares nodes to reduce transistors. The mux-select syntax 60a, 60b, multiple output syntax 58A, shared node syntax 58B, and capacitance isolation syntax 58C are each discussed separately below.

Mux-Select Syntax

Muxes may be described in terms of their transistor configuration as either a bottom-select mux or a top-select mux. Bottom-select muxes comprise multi-pronged intermediate nodes and therefore require fewer transistors than top-select muxes, but at the expense of potential capacitance problems and therefore slower performance. Top-select muxes comprise select devices at the top of the evaluate stack. Because only the selected stack may couple to the evaluate node, top-select muxes exhibit better capacitance isolation than bottom-select muxes. Top-select muxes may therefore operate more quickly, but at the expense of additional transistors.

The present invention's mux-select syntax 60a, 60b allows a user to selectively describe either a bottom-select mux, a top-select mux, or some combination thereof. By utilizing the following syntax pattern for a select context gate expression, the user may describe a top-select mux: (select-value*select-node)|(select-value*select-node). This placement of the select-value term before the select-node term in the gate expression defines for the transistor synthesis tool 24 a top-select multiplexer. For instance, the transistor synthesis tool 24 produces the top-select mux transistor configuration illustrated in FIG. 11 for the gate expression 56 set forth in Equation 3:

$$(z\_4H0*(s\_3H0==0))|(y\_4H0*(s\_3H0==1))|(x\_4H0*(s\_3H0==2)) \quad \text{(Equ. 3)}$$

Figure 11:
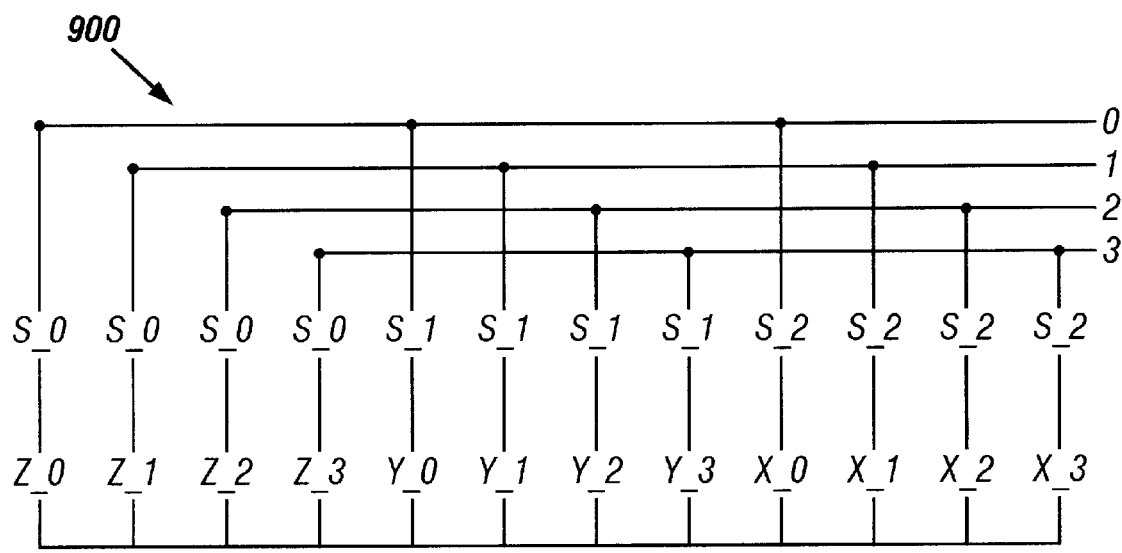
FIG. 11 is a top-select mux transistor arrangement described by the gate expression of Equation 3.

FIG. 11 illustrates that, for Equation 3, the transistor synthesis tool 24 creates a multiplexer that selects a 1-of-4 signal based upon the value of the select signal, s__3H0. In contrast, the gate expression 56 set forth in Equation 3 could be implemented as a bottom-select multiplexer. The mux-select syntax 60 of the present invention enables a user to do so by utilizing a bottom-select syntax pattern in the gate expression 56: (select-node*select-value)|(select-node*select-value). For instance, the transistor synthesis tool 24 produces the bottom-select mux transistor configuration illustrated in FIG. 12 for the gate expression 56 set forth in Equation 4:

$$((s\_3H0==0)*z\_4H0)|((s\_3H0==1)*y\_4H0)|((s\_3H0==2)*x\_4H0) \quad \text{(Equ. 4)}$$

Figure 12:
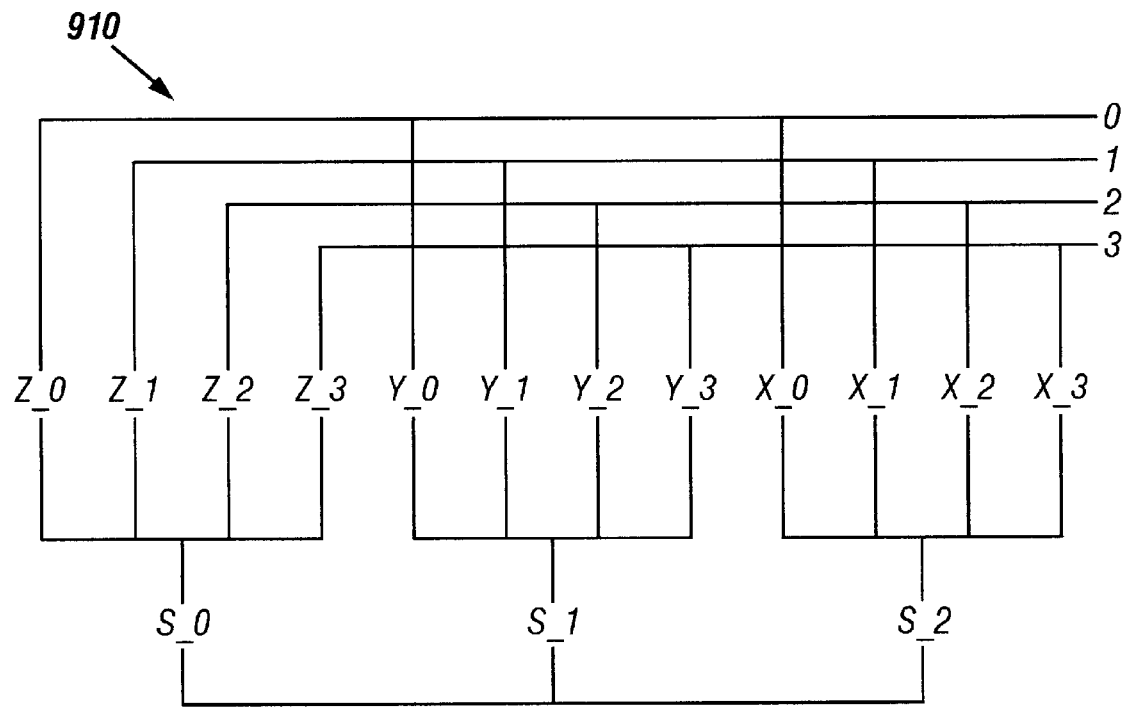
FIG. 12 is a bottom-select mux transistor arrangement described by the gate expression of Equation 4.

The functions performed by the gate 900 in FIG. 11 and the gate 910 in FIG. 12 are identical, just as Equations 3 and 4 are logically identical.

Figure 13:
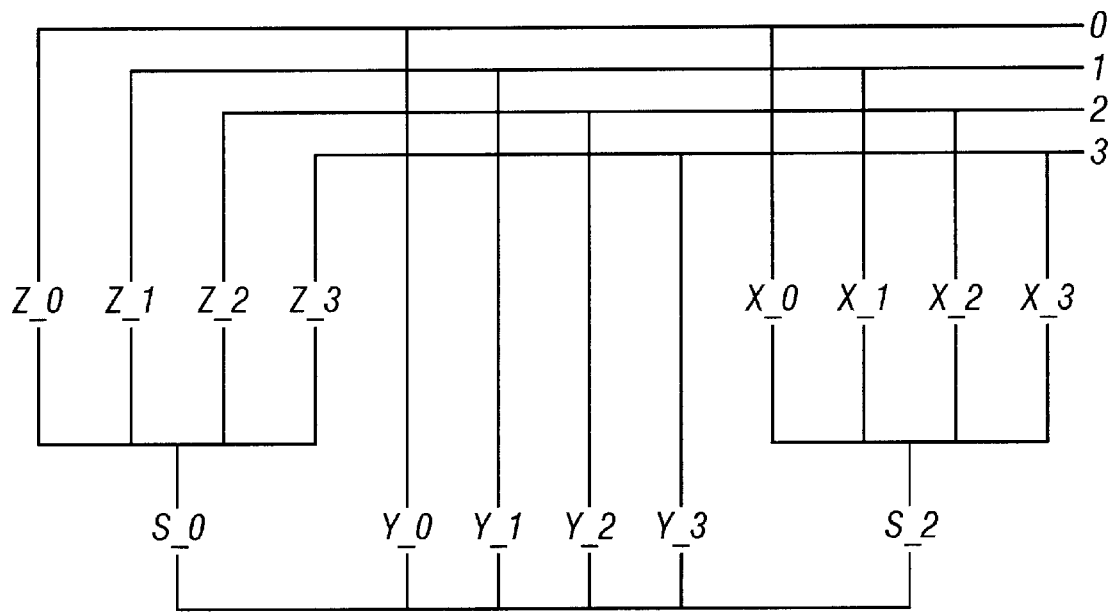
FIG. 13 is a hybrid mux transistor arrangement described by the gate expression of Equation 5.

To illustrate a hybrid type of mux gate, the same function set forth in Equations 3 and 4 is set forth in Equation 5. FIG. 13 illustrates that Equation 5 utilizes the mux-select syntax 60 to produce a transistor configuration that is a hybrid of top- and bottom-select muxes.

$$((s\_3H0==0)*z\_4H0)|(y\_4H0*(s\_3H0==1))|((s\_3H0==2)*x\_4H0) \quad \text{(Equ. 5)}$$

As a final illustration of the mux-select syntax 60, consider Equations 6 and 7. Equation 6 sets forth a description of another top-select mux and illustrates the use of the logical connective "||" in the select-node. Equation 7 illustrates the use of the logical connective "&&" in the select-node and the use of integer constants as the select-value.

$$(z\_4H0*((s\_3H==0)\|(s\_3H0==2)))|(y\_4H0*(s\_3H0==1)) \quad \text{(Equ. 6)}$$

$$(((s0\_3H0==0)\&\&(s1\_3H0!=2))*0)|$$

$$(((s0\_3H0!=0)\&\&(s1\_3H0==2))*1)|$$

$$(((s0\_3H0>0)\&\&(s1\_3H0<2))*2)|$$

$$(((s0\_3H0<1)\&\&(s1\_3H0>1))*3) \quad \text{(Equ. 7)}$$

Figure 14:
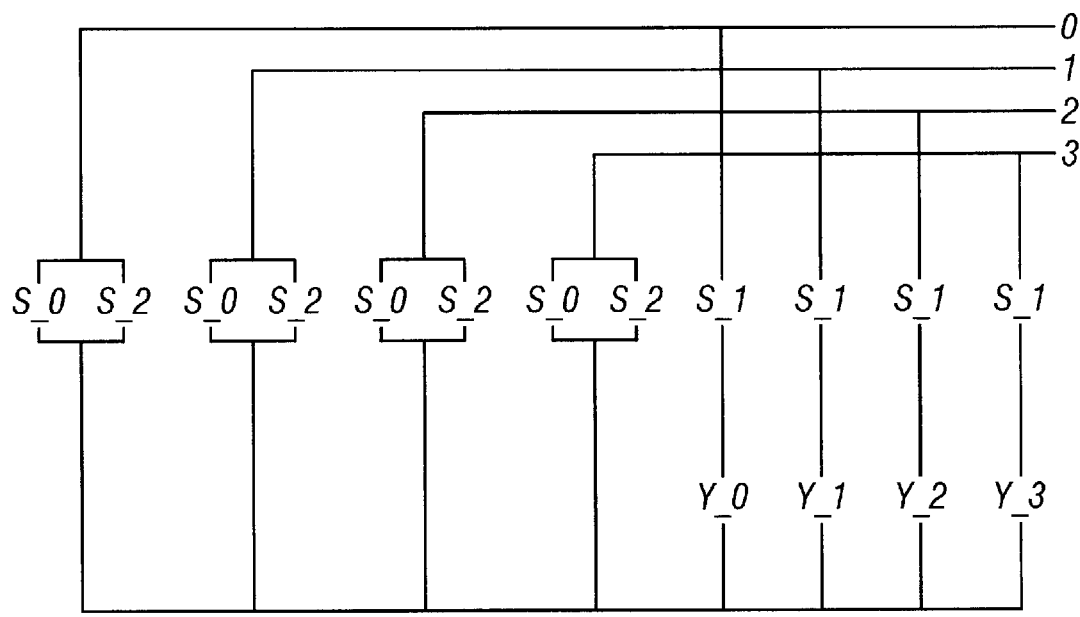
FIG. 14 is a top-select mux transistor arrangement described by the gate expression of Equation 6.
Figure 15:
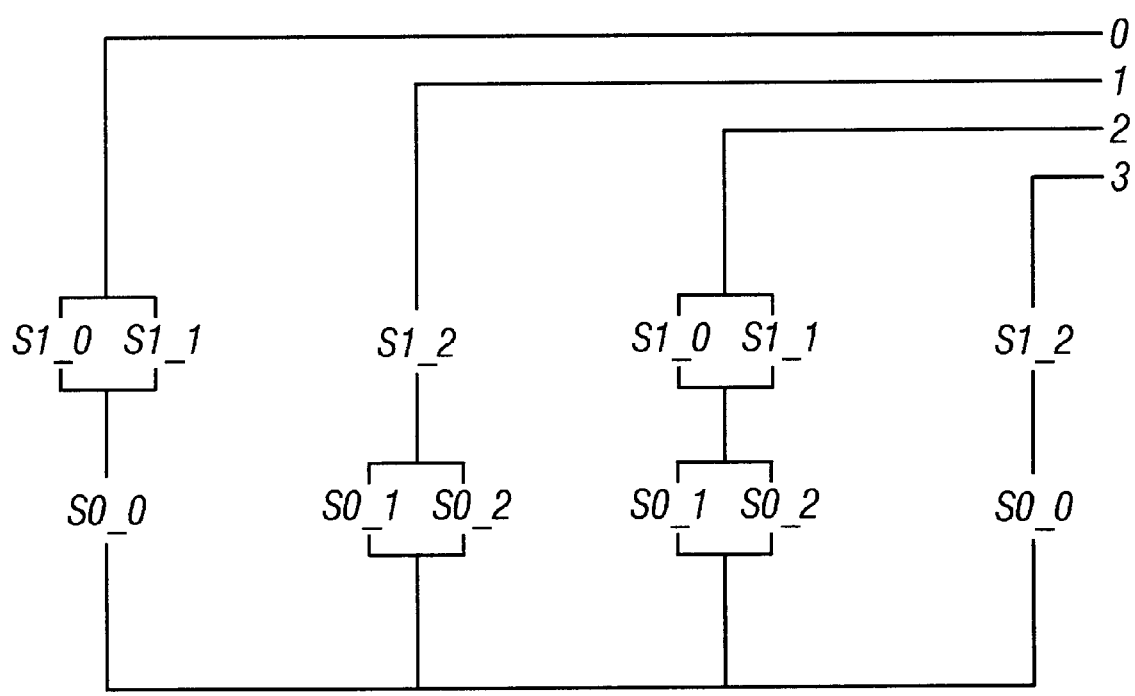
FIG. 15 is a mux transistor arrangement described by the gate expression of Equation 7.

FIG. 14 illustrates the transistor configuration associated with Equation 6. FIG. 15 illustrates the transistor configuration associated with Equation 7.

Compound Statement Syntax

In addition to the mux-select syntax 60, a user of the present invention 101 may utilize a compound statement syntax 73 to describe several gate optimizations to the transistor synthesis tool 24, including control over the number of output signals, the use of output drivers to isolate capacitance, and the use of shared nodes to reduce gate size. Each of these optimizations is discussed separately below.

A user of the present invention 101 may utilize a simple statement syntax 72 or a compound statement syntax 73 in forming a gate expression 56. While the compound statement syntax 73 allows the user more control over transistor configuration, any logic function that can be expressed in a compound statement can also be expressed as a single statement gate expression (although the physical circuit description 40 generated by the present invention for such a single statement gate expression may be inefficient). A compound gate expression is formed by using a grouping construct to group together a set of declarations and simple statements so that they are syntactically equivalent to a single simple statement. FIGS. 9 and 9A illustrate that, in the preferred embodiment of the present invention, the grouping construct used for a compound gate expression comprises a set of curly braces, "{" and "}" 57.

Low-going signals are the mechanism within the compound statement syntax through which a user may describe to the transistor synthesis tool 24 certain gate optimization features. As discussed above, signals that evaluate on the falling edge of the clock are called low-going signals. Low-going signals are defined solely as intra-gate signals in the preferred embodiment. In contrast, all signals into and out of gates are defined in the preferred embodiment as high-going signals.

The preferred embodiment of the present invention 101 allows the user to utilize low-going signals in connection with compound statement gate expressions 56b to name a portion of, or all of, the evaluation stack. Conceptually, the low-going signal is only used as an intermediate signal used internally within the gate.

Low-going signals may be used within a gate in much the same manner that high-going signals are utilized, but with certain limitations. One such limitation is a subtle one. Because a low-going signal represents a portion of the evaluation stack already built and connected to ground, it can only be used in those locations in an expression that assume a connection to ground. For example, consider a low-going signal, low__2L5, and a high-going signal, high__2H4. The expression set forth in Equation 8 is a valid statement while the expression set forth in Equation 9 is not.

$$\text{out\_3H5=low2\_L5+high\_2H4;} \quad \text{(Equ. 8)}$$

$$\text{out\_3H5=high\_2H4+low\_2L5;} \quad \text{(Equ. 9)}$$

A final limitation on the use of low-going signals is that once a simple statement assigning to a high-going signal occurs in a compound statement gate expression 56, the preferred embodiment will not support any further assignments to low-going signals within that compound statement gate expression 56.

Multiple Output Syntax

Figure 16:
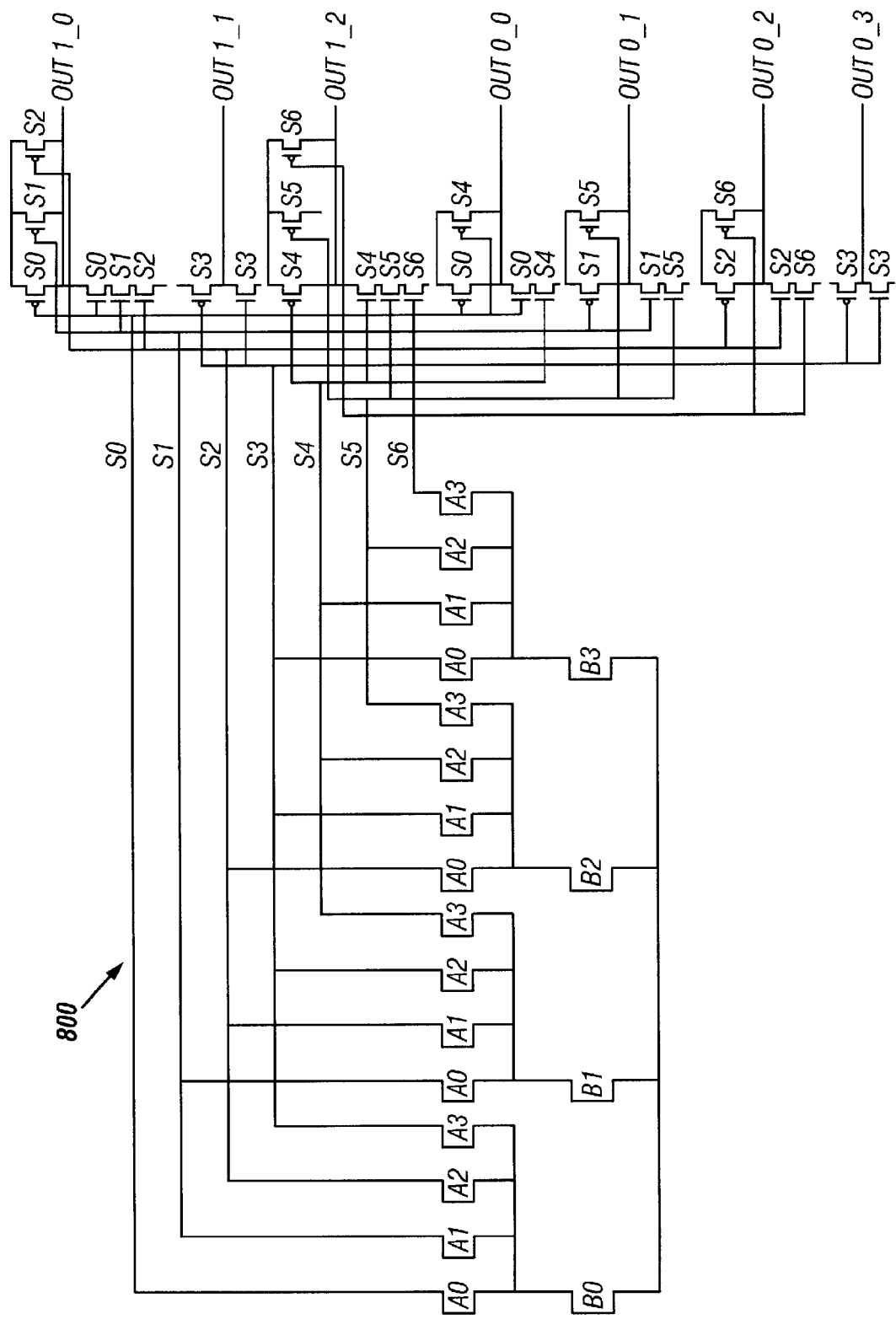
FIG. 16 is a 2-output logic gate described by the gate expression of Equation 10.

Another gate optimization feature described in the compound statement syntax 73 is the multiple output signal. A multiple output syntax 58A, which comprises a subset of the compound statement syntax 73, provides the user the ability to define multiple outputs from a single gate. In the multiple output syntax 58A, signals are defined for a gate if a compound statement gate comprises multiple simple statements assigning to high-going signals. FIG. 16 illustrates an example of a gate that generates two separate outputs signals: a sum signal and an HPG signal. Equation 10 shows an example of N-NARY C code that would generate gate 800 shown in FIG. 16.

$$\{\text{net int\_7L1;}$$
$$\text{int\_7L1=y\_4H0+z\_4H0;}$$
$$\text{out0\_4H1=int\_7L1\&0x3;}$$
$$\text{out1\_3H1=((int\_7L1<3)*0)|((int\_7L1==3)*2)|((int\_7L1>3)*1);}\} \quad \text{(Equ. 10)}$$

Shared Node Syntax

Figure 17:
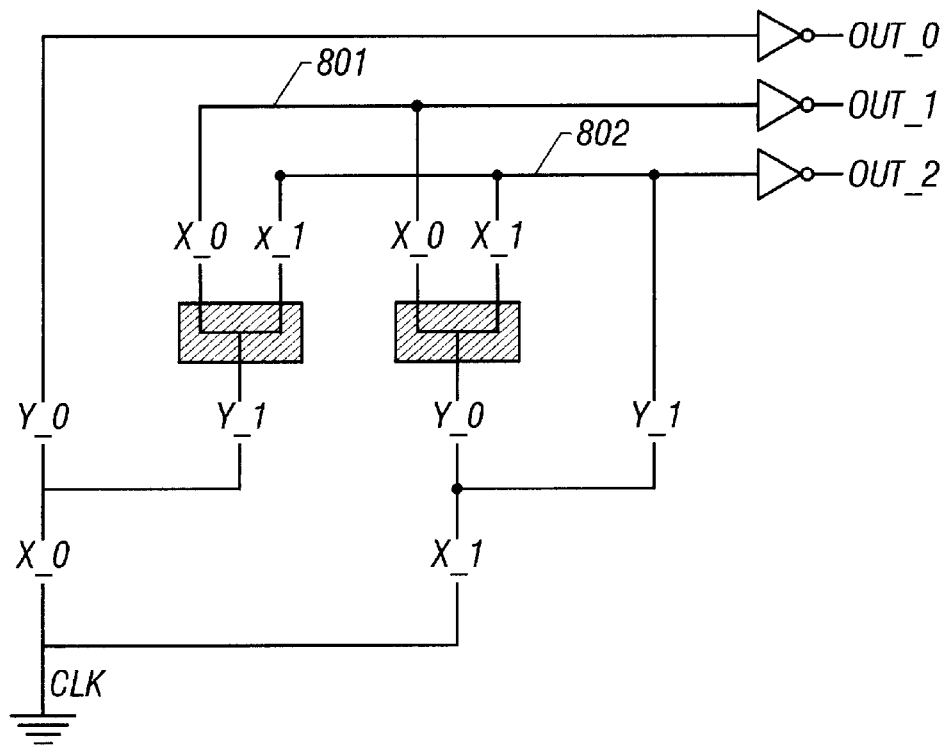
FIG. 17 illustrates upwardly equivalent nodes in a transistor arrangement described by the gate expression of Equation 11.

As a third syntax subset of the compound statement syntax 73, the preferred embodiment of the present invention provides a shared node syntax 58B. Sometimes one can simplify a gate by combining nodes closer to the output even though the nodes closer to ground are not combined. When the functions below two distinct nodes in an n-stack are identical, we call the those nodes downwardly equivalent nodes. Similarly, when the functions above two distinct nodes in an n-stack are identical, we call those nodes upwardly equivalent nodes. For example, FIG. 17 shows two upwardly equivalent nodes, which are shaded. The shared node syntax 58B provides a means for allowing the user to describe the gate illustrated in FIG. 18, in which the two upwardly equivalent nodes are combined into a single node. Equation 11 sets forth the N-NARY C simple statement gate instantiation that describes the gate depicted in FIG. 17. In contrast, Equation 12 sets forth an example of the shared node syntax 58B that results in the transistor configuration illustrated in FIG. 18.

$$\text{out\_3H1=((z\_2H0==0)*(((y\_2H0==0)*0)|((y\_2H0!=0)*}$$
$$(x\_2H0==0)*1)|((x\_2H0!=0)*2))))|((z\_2H0!=0)*$$
$$(((y\_2H0==0)*((x\_2H0==0)*1)|((x\_2H0!=0)))|((y\_2H0!=2)); \quad \text{(Equ. 11)}$$

$$\{\text{net int\_3L1;}$$
$$\text{int\_3L1=((z\_2H0==0)*}$$
$$(((y\_2H0==0)*0)|$$
$$((y\_2H0!=0)*1)))|$$
$$((z\_2H0!=0)*$$
$$(((y\_2H0==0)*1)|$$
$$((y\_2H0!=0)*2));$$
$$\text{out\_2H1=((int\_3L1==0)*0)|}$$
$$((\text{int\_3L1==1})*$$
$$(((x\_2H0==0)*1)|$$
$$((x\_2H0==1)*2)))|$$
$$((\text{int\_3L1==2})*2);\} \quad \text{(Equ. 12)}$$

In Equation 12, the low-going signal int__3L1 is first generated. Note that if z__2H0==0 and y__2H0!=0, then int__3L1 is set to 1. Note also that if z__2H0!=0 and y__2H0==0, then int__3L1 is set to 1. Since both these cases result in a value of 1 for int__3L1, the drains of transistors 998 and 999 are tied together. Signal int__3L1 is then used in the second statement of this compound statement gate. From the node assigned the value of 1, we attach the two transistors that were above the upwardly equivalent nodes in FIG. 17.

Capacitance Isolation Syntax

As the final syntax subset of the compound statement syntax 73, the preferred embodiment of the present invention provides a capacitance isolation syntax 58C. Sometimes one can improve the performance of a gate by rearranging or adding transistors, or by adding nodes, to reduce parasitic capacitance that occurs when nodes that are not on the evaluate path are nevertheless electrically coupled to the evaluate path. The causes of undesirable parasitic capacitance in logic circuits and techniques for reducing or eliminating parasitic capacitance in logic circuits is the subject of a copending patent application, U.S. patent application Ser. No. 09/209,967, filed Dec. 10, 1998, now U.S. Pat. No. 6,124,735, and titled "Method and Apparatus for a N-NARY Logic Circuit using Capacitance Isolation", which is incorporated herein for all purposes.

Figure 18:
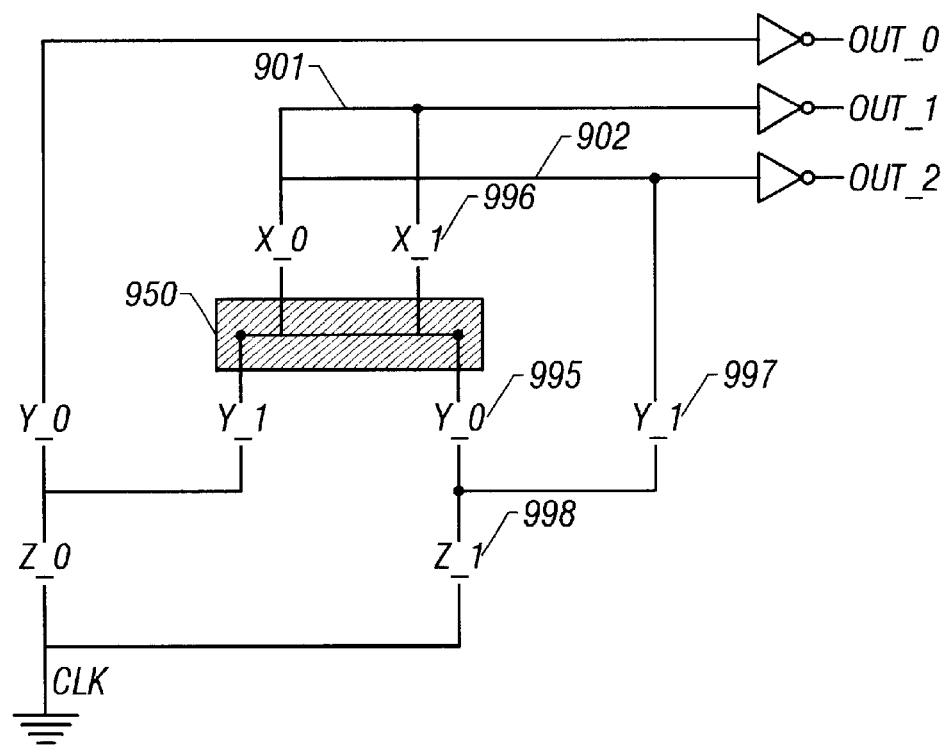
FIG. 18 illustrates a transistor arrangement with shared nodes as described by the gate expression of Equation 12.

As an example of how parasitic capacitance can occur and can be minimized in logic circuits, compare the circuit in FIG. 17 to the circuit in FIG. 18. Although the two circuits perform the same logic function, in FIG. 18, we have saved two transistors and reduced undesirable parasitic capacitance. The evaluate node 901 that is attached (through the output driver) to output 1 is attached to a single n-channel device drain in FIG. 18, whereas in FIG. 17, the same node 801 was attached to two drains and both n-channel devices were controlled by the same input value. A similar situation arises on evaluate nodes 802 versus 902.

However, evaluate node 902 still has a capacitance isolation problem, because the signal values controlling transistors 996 and 997 are not orthogonal. Thus, if transistors 996, 997, and 998 are all turned on and transistor 995 if off, then node 950 must be discharged through evaluate node 902 in order to switch out_2.

Figure 19:
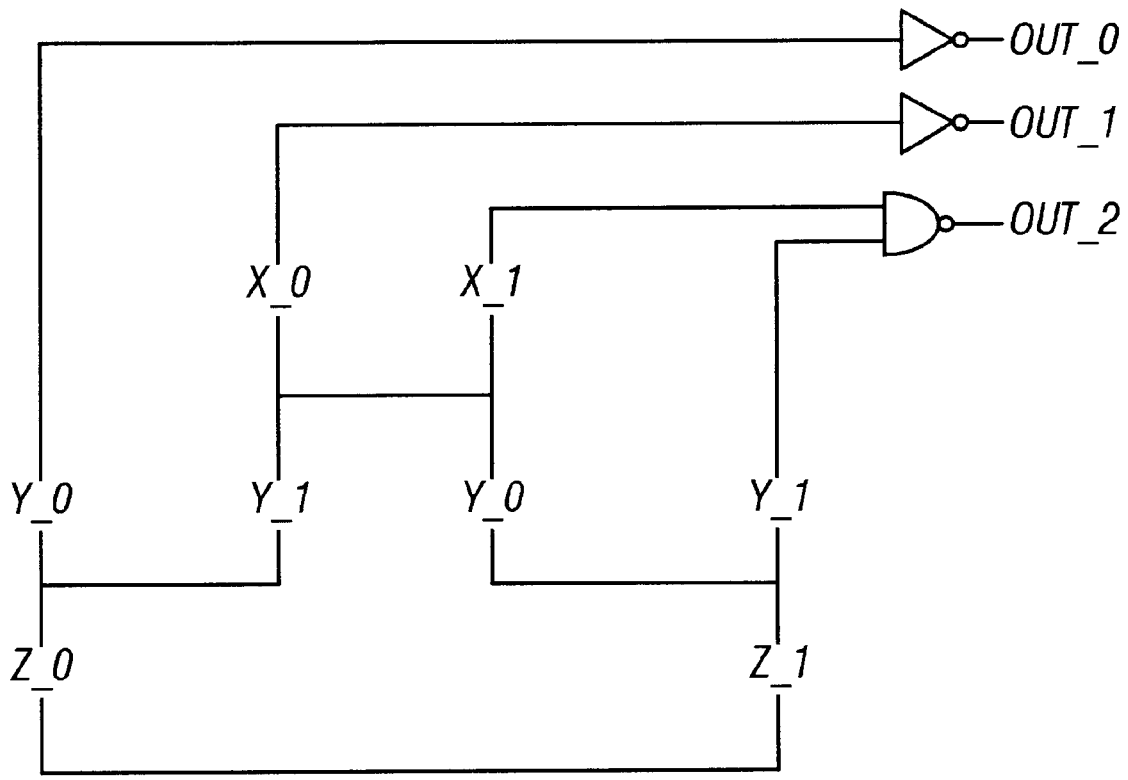
FIG. 19 shows the circuit of FIG. 18 with improved capacitance isolation.

To further improve the capacitance isolation characteristics of the circuit shown in FIG. 18, we use a complex output driver for out_2. Instead of connecting the drains of transistors 997 and 996 and feeding that into an inverter driver, we combine them in a 2-input NAND gate driver as shown in FIG. 19. The compound statement gate instruction that results in the circuit shown in FIG. 19 is given by:

{net int0_3L1;

net int1_4L1;

int0_3L1=((z_2H0=0)*

(((y_2H0=0)*0)|

((y_2H0!=0)*1)))|

((z_2H0!=0)*

(((y_2H0==0)*1)|

((y_2H0!=0)*2)));

int1_4L1=((int0_3L1==0)*0)|

((int0_3L1==1)*

(((x_2H0==0)*1)|

((x_2H0!==1)*2)))|

((int0_3L1==2)*3);

out_2H1=((int1_4L1==0)*0)|

((int1_4L1==1)*1)|

((int1_4L1==2)*2)|

((int1_4L1==3)*2);|} (Equ. 13)

The compiler understands that when it sees a set of low-going signals (only) on the right hand side, and a high-going signal on the left hand side, it should use complex output drivers instead of connecting nodes and feeding them into simple inverter output drivers. The circuit of FIG. 19 is fully capacitance isolated.

Figure 20:
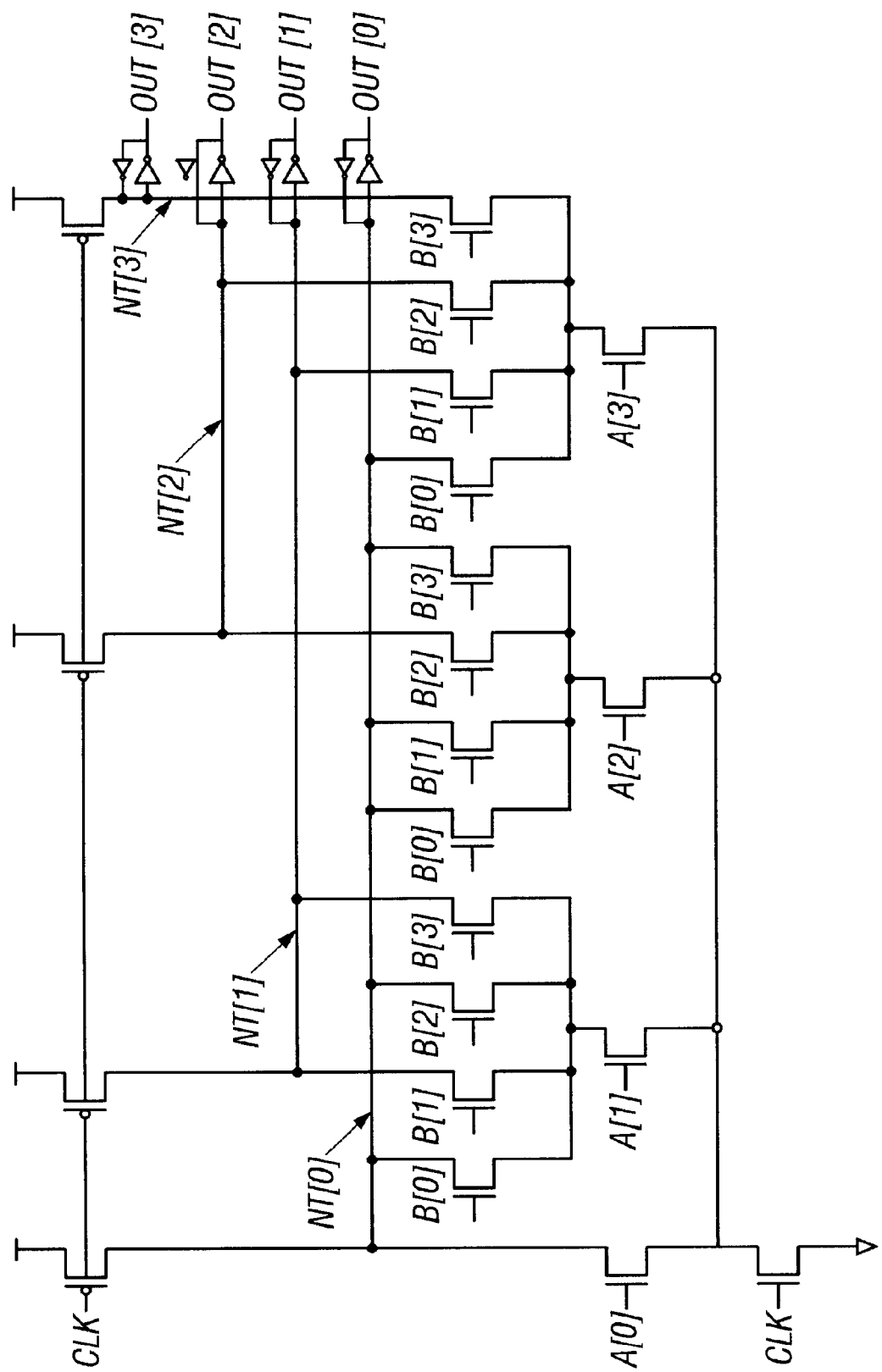
FIG. 20 shows a N-NARY AND gate with specific transistor configuration.

FIGS. 20 through 23 show four different AND gates that are logically identical but have different transistor arrangements and performance characteristics. The gate shown in FIG. 20 is described by the gate instantiation:

{s2_and_B3_2_4h1=(s2_a_B7_6_4h0)==1)*1|

(s2_a_B7_6_4h0==2)*((s2_b_B7_6_4h0==1)*1|

(s2_b_B7_6_4h0==2)*2|

(s2_b_B7_6_4h0==3)*1|

(s2_b_B7_6_4h0==4)*2)|

(s2_a_B7_6_4h0==3)*((s2_b_B7_6_4h0==1)*1|

(s2_b_B7_6_4h0==2)*1|

(s2_b_B7_6_4h0==3)*3|

(s2_b_B7_6_4h0==4)*3|

(s2_a_B7_6_4h0==4)*s2_b_B7_6_4h0;} (Equ. 14)

Figure 21:
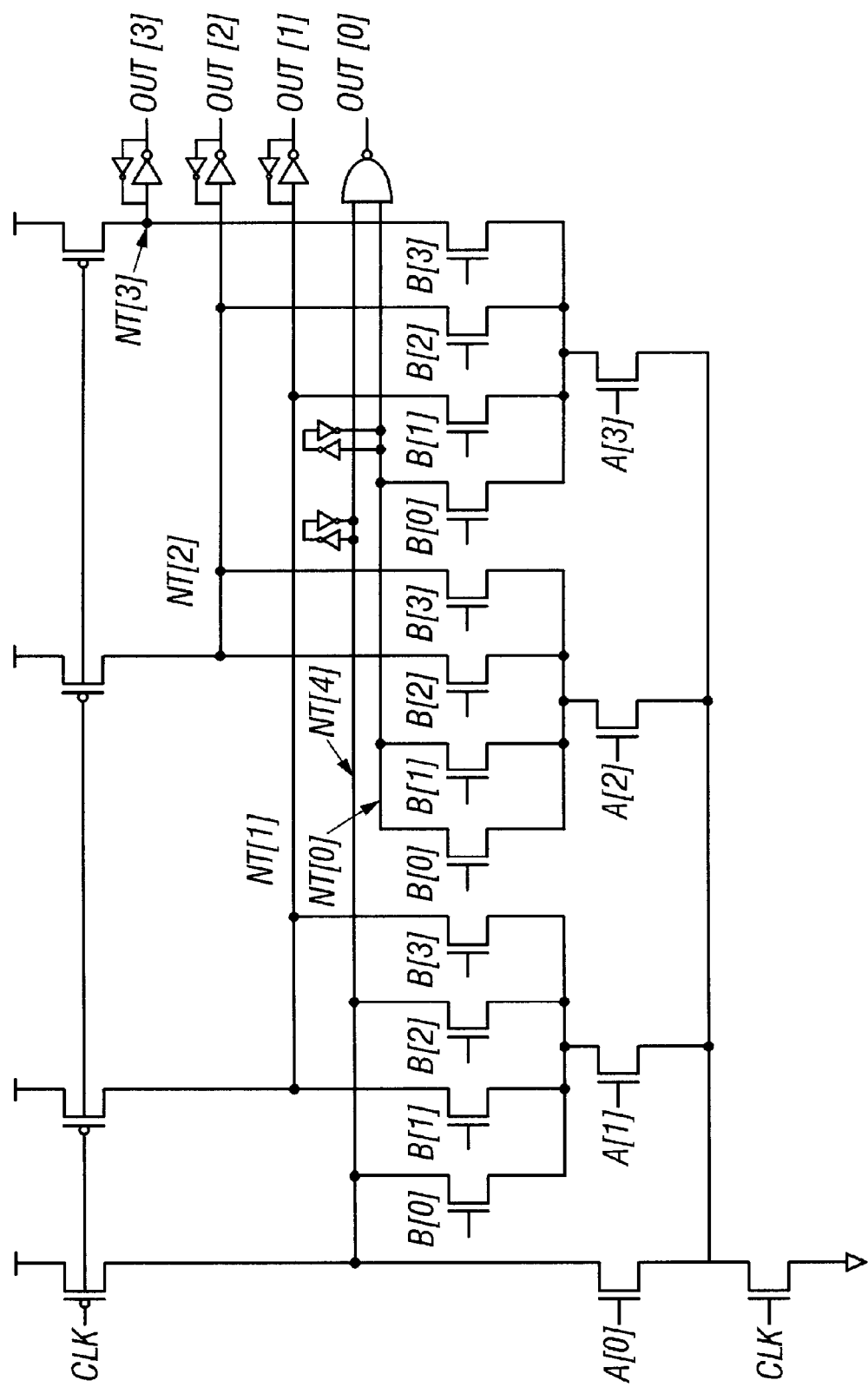
FIG. 21 shows a N-NARY AND gate that is logically identical to the FIG. 20 AND gate, but has a different transistor configuration.

The gate shown in FIG. 21 is described by the gate instantiation:

{Internal_Signal s2_and_B1_0_511;

s2_and_B1_0_511=(s2_a_B7_6_4h0==1)*5|

(s2_a_B7_6_4h0==2)*((s2_b_B7_6_4h0==1)*5|

(s2_b_B7_6_4h0==2)*2|

(s2_b_B7_6_4h0==3)*5|

(s2_b_B7_6_4h0==4)*2)|

(s2_a_B7_6_4h0==3)*((s2_b_B7_6_4h0==1)*1|

(s2_b_B7_6_4h0==2)*1|

(s2_b_B7_6_4h0==3)*3|

(s2_b_B7_6_4h0==4)*3|

(s2_a_B7_6_4h0==4)*s2_b_B7_6_4h0;

s2_and_B1_0_4h1=(s2_and_B1_0_511==1)*1|

(s2_and_B1_0_511==2)*2|

(s2_and_B1_0_511==3)*3|

(s2_and_B1_0_511==4)*4|

(s2_and_B1_0_511==5)*1;} (Equ. 15)

Figure 22:
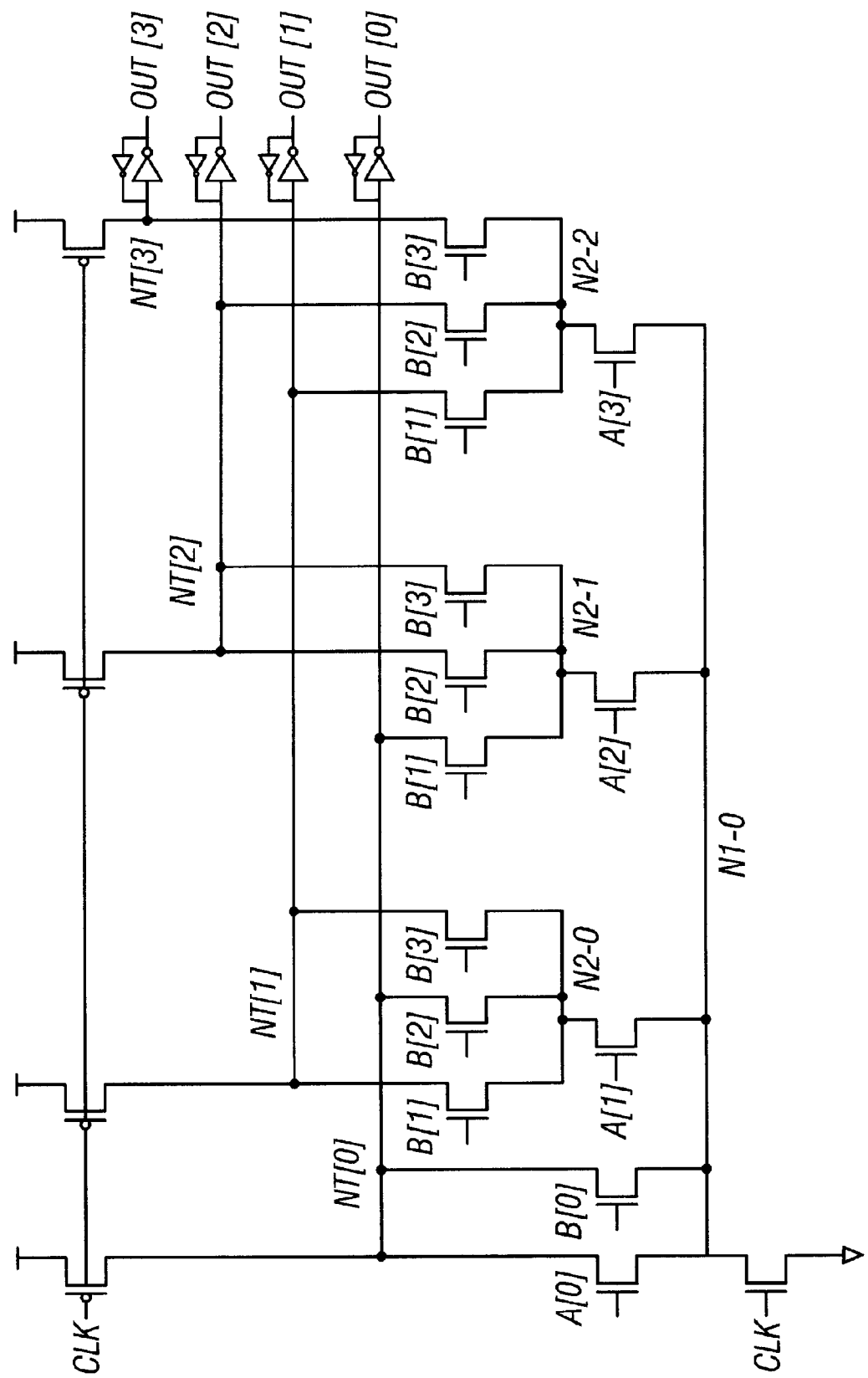
FIG. 22 shows a N-NARY AND gate that is logically identical to the FIGS. 20 and 21 AND gates, but has a different transistor configuration.

The gate shown in FIG. 22 is described by the gate instantiation:

{s2_and_b5_4_4h1+(s2_a_b7_6_4h0==1)*1|

(s2_b_B7_6_4h0==1)*1|

(s2_a_B7_6_4h0==2)*((s2_b_B7_6_4h0==2)*2|

$(s2\_b\_B7\_6\_4h0==3)*1|$ $(s2\_b\_B7\_6\_4h0==4)*2)|$ $(s2\_a\_B7\_6\_4h0==3)*((s2\_b\_B7\_6\_4h0==2)*1|$ $(s2\_b\_B7\_6\_4h0==3)*3|$ $(s2\_b\_B7\_6\_4h0==4)*3)|$ $(s2\_a\_B7\_6\_4h0==4)*((s2\_b\_B7\_6\_4h0==2)*2|$ $(s2\_b\_B7\_6\_4h0=32\ 2)*3|$ $(s2\_b\_B7\_6\_4h0==4)*4;\}$ (Equ. 16)

Figure 23:
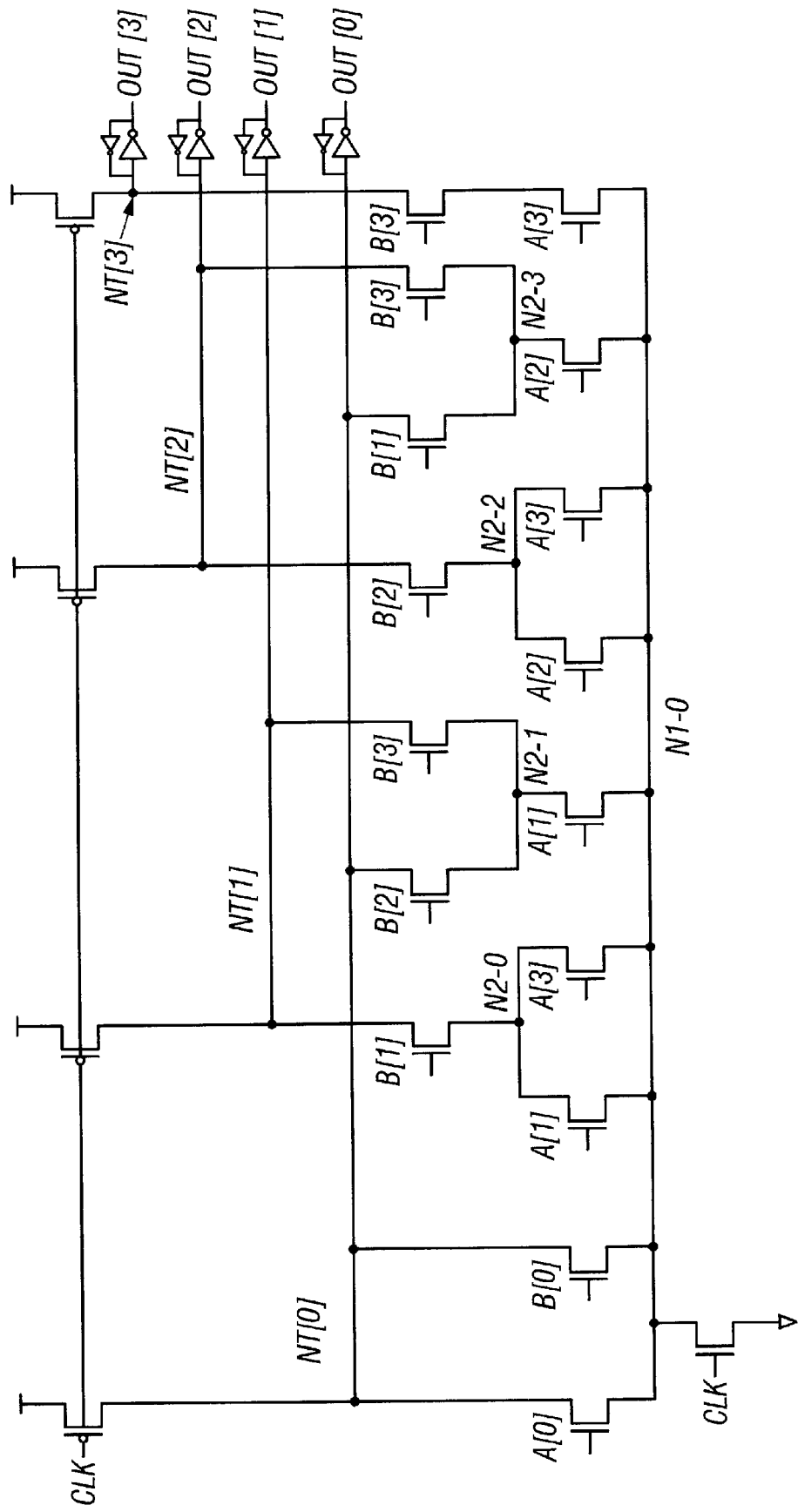
FIG. 23 shows a N-NARY AND gate that is logically identical to the FIGS. 20–22 AND gates, but has a different transistor configuration.

The gate shown in FIG. 23 is described by the gate instantiation:

$\{s2\_and\_B7\_6\_4h1=((s2\_a\_B7\_6\_4h0==1)*1)|$ $((s2\_b\_B7\_6\_4h0==1)*1|$ $((((s2\_a\_B7\_6\_4h0==2)||$ $(s2\_a\_B7\_6\_4h0==4))\&\&(s2\_b\_B7\_6\_4h0==2))*2)|$ $((s2\_a\_B7\_6\_4h0==2)*((s2\_b\_B7\_6\_4h0==3)*1|$ $(s2\_b\_B7\_6\_4h0==4)*2))|$ $((((s2\_a\_B7\_6\_4h0==3)||$ $(s2\_a\_B7\_6\_4h0==4))\&\&(s2\_b\_B7\_6\_4h0==3)*3)|$ $((s2\_a\_B7\_6\_4h0==3)*((s2\_b\_B7\_6\_4h0==2)*1|$ $(s2\_b\_B7\_6\_4h0==4)*3))|$ $((s2\_a\_B7\_6\_4h0==4)\&\&(s2\_b\_B7\_6\_4h0==4)*4;\}$ (Equ. 17)

Depending upon the particular needs of the system under design, any one of the FIGS. 20–23 AND gates might be considered a superior design, even though all the gates perform the same logical function. The capability of the present invention to identify multiple configurations of the same logical function provides the circuit designer with flexibility to explore and optimize circuit design parameters other than the logical output of the circuit.

In sum, the compiler 20 of the present invention 101 generates a physical circuit description 40 and a behavioral model 30 from one syntax statement 10. The compiler 20 comprises two components: a make-model component 22 that generates the behavioral model 30 and a transistor synthesis tool 24 that generates the physical circuit description 40. The make-model component 22 further comprises a pre-compiler 22A and a commercial C compiler 22B.

The syntax statement 10 is generated using a signal naming convention, a simple statement syntax 72 for describing a gate instantiation 12, and a compound statement syntax 73 for describing a gate instantiation 12. The signal naming convention requires that each signal name 70 comprise a 1-of-N degree field 51, an evaluation field 52, and a clock phase field 53. The signal naming convention also allows each signal name 70 to further comprise a descriptor field 50 and a bit field 59.

Both the simple statement syntax 72 and the complex statement syntax 73 further comprise a mux-select syntax 60 that allows a user to describe a top-select mux, a bottom-select mux, or a hybrid mux.

The compound statement syntax further comprises a capacitance isolation syntax 58C, a multiple output syntax 58A, and a shared node syntax 58B.

Other embodiments of the invention will be apparent to those skilled in the art after considering this specification or practicing the disclosed invention. The specification and examples above are exemplary only, with the true scope of the invention being indicated by the following claims.

We claim the following invention:

1. A design tool to design a N-NARY logic circuit, comprising:
   a syntax statement, said syntax statement further comprises encoded information describing the desired logical function of the N-NARY logic circuit and encoded information describing a specific transistor configuration that further comprises a precharge circuit, an evaluation circuit, a plurality of output drivers, and a shared logic tree circuit having multiple evaluation paths wherein one and only one evaluation path is active during an evaluation cycle, said shared logic tree circuit receives one or more 1-of-N input signals and produces one or more 1-of-N output signals; and
   a compiler that processes and decodes said syntax statement, said compiler produces from said syntax statement a behavioral model of the N-NARY circuit and a physical circuit description of said shared logic tree circuit, said precharge circuit, said evaluation circuit, and said plurality of output drivers.

2. The tool of claim 1 wherein said syntax statement further comprises a signal output variable that identifies said one or more 1-of-N output signals, a gate operator, and a gate expression.

3. The tool of claim 2 wherein said gate expression further comprises one or more of the following expressions: a mux select expression, an arithmetic expression, a logical expression, a multiple output expression, a capacitance isolation expression, or a shared node expression.

4. The tool of claim 2 wherein said signal output variable further comprises a 1-of-N N-NARY signal degree identifier, an evaluation indicator, and a evaluation clock phase indicator.

5. The tool of claim 4 wherein said evaluation indicator further comprises information identifying whether said one or more 1-of-N output signals are valid N-NARY signals that have completed evaluation or whether said one or more 1-of-N output signals represent a null value.

6. The tool of claim 1 wherein said compiler further comprises a transistor synthesis tool and a make-model component, said make-model component further comprising a pre-compiler.

7. A system that supports N-NARY circuit design, comprising:
   a syntax statement, said syntax statement further comprises encoded information describing the desired logical function of the N-NARY logic circuit and encoded information describing a specific transistor configuration that further comprises a precharge circuit, an evaluation circuit, a plurality of output drivers, and a shared logic tree circuit having multiple evaluation paths wherein one and only one evaluation path is active during an evaluation cycle, said shared logic tree circuit receives one or more 1-of-N input signals and produces one or more 1-of-N output signals; and
   a compiler that processes and decodes said syntax statement, said compiler produces from said syntax statement a behavioral model of the N-NARY circuit and a physical circuit description of said shared logic tree circuit, said precharge circuit, said evaluation circuit, and said plurality of output drivers.

8. The system of claim 7 wherein said syntax statement further comprises a signal output variable that identifies said one or more 1-of-N output signals, a gate operator, and a gate expression.

9. The system of claim 8 wherein said gate expression further comprises one or more of the following expressions: a mux select expression, an arithmetic expression, a logical expression, a multiple output expression, a capacitance isolation expression, or a shared node expression.

10. The system of claim 8 wherein said signal output variable further comprises a 1-of-N N-NARY signal degree identifier, an evaluation indicator, and a evaluation clock phase indicator.

11. The system of claim 10 wherein said evaluation indicator further comprises information identifying whether said one or more 1-of-N output signals are valid N-NARY signals that have completed evaluation or whether said one or more 1-of-N output signals represent a null value.

12. The system of claim 7 wherein said compiler further comprises a transistor synthesis tool and a make-model component, said make-model component further comprising a pre-compiler.

13. A method of manufacturing an N-NARY circuit design tool, comprising:

providing a syntax statement, said syntax statement further comprises encoded information describing the desired logical function of the N-NARY logic circuit and encoded information describing a specific transistor configuration that further comprises a precharge circuit, and evaluation circuit, a plurality of output drivers, and a shared logic tree circuit having multiple evaluation paths wherein one and only one evaluation path is active during an evaluation cycle, said shared logic tree circuit receives one or more 1-of-N input signals and produces one or more 1-of-N output signals; and providing a compiler that processes and decodes said syntax statement, said compiler produces from said syntax statement a behavioral model of the N-NARY circuit and a physical circuit description of said shared logic tree circuit, said precharge circuit, said evaluation circuit, and said plurality of output drivers.

14. The method of claim 13 wherein said syntax statement further comprises a signal output variable that identifies said one or more 1-of-N output signals, a gate operator, and a gate expression.

15. The methods of claim 14 wherein said gate expression further comprises one or more of the following expressions: a mux select expression, an arithmetic expression, a logical expression, a multiple output expression, a capacitance isolation expression, or a shared node expression.

16. The method of claim 14 wherein said signal output variable further comprises a 1-of-N N-NARY signal degree identifier, an evaluation indicator, and a evaluation clock phase indicator.

17. The method of claim 16 wherein said evaluation indicator further comprises information identifying whether said one or more 1-of-N output signals are valid N-NARY signals that have completed evaluation or whether said one or more 1-of-N output signals represent a null value.

18. The method of claim 13 wherein said compiler further comprises a transistor synthesis tool and a make-model component, said make-model component further comprising a pre-compiler.

19. A method of designing N-NARY circuits using an N-NARY design tool, said method comprising:

developing a syntax statement, said syntax statement further comprises encoded information describing the desired logical function of the N-NARY logic circuit and encoded information describing a specific transistor configuration that further comprises a precharge circuit, an evaluation circuit, a plurality of output drivers, and a shared logic tree circuit having multiple evaluation paths wherein one and only one evaluation path is active during an evaluation cycle, said shared logic tree circuit receives one or more 1-of-N input signals and produces one or more 1-of-N output signals; and providing said syntax statement to a compiler that processes and decodes said syntax statement, said compiler produces from said syntax statement a behavioral model of the N-NARY circuit and a physical circuit description of said shared logic tree circuit, said precharge circuit, said evaluation circuit, and said plurality of output drivers.

20. The method of claim 19 wherein said syntax statement further comprises a signal output variable that identifies said one or more 1-of-N output signals, a gate operator, and a gate expression.

21. The method of claim 20 wherein said gate expression further comprises one or more of the following expressions: a mux select expression, an arithmetic expression, a logical expression, a multiple output expression, a capacitance isolation expression, or a shared node expression.

22. The method of claim 20 wherein said signal output variable further comprises a 1-of-N N-NARY signal degree identifier, an evaluation indicator, and a evaluation clock phase indicator.

23. The method of claim 22 wherein said evaluation indicator further comprises information identifying whether said one or more 1-of-N output signals are valid N-NARY signals that have completed evaluation or whether said one or more 1-of-N output signals represent a null value.

24. The method of claim 19 wherein said compiler further comprises a transistor synthesis tool and a make-model component, said make-model component further comprising a pre-compiler.

25. A program storage device readable by a machine, tangibly embodying a program of instructions executable by the machine to perform a method of designing N-NARY circuit, said method comprising:

developing a syntax statement, said syntax statement further comprises encoded information describing the desired logical function of the N-NARY logic circuit and encoded information describing a specific transistor configuration that further comprises a precharge circuit, an evaluation circuit, a plurality of output drivers, and a shared logic tree circuit having multiple evaluation paths wherein one and only one evaluation path is active during an evaluation cycle, said shared logic tree circuit receives one or more 1-of-N input signals and produces one or more 1-of-N output signals; and providing said syntax statement to a compiler that processes and decodes said syntax statement, said compiler produces from said syntax statement a behavioral model of the N-NARY circuit and a physical circuit description of said shared logic tree circuit, said precharge circuit, said evaluation circuit, and said plurality of output drivers.

26. The program storage device of claim 25 wherein said syntax statement developed in said design method further comprises a signal output variable that identifies said one or more 1-of-N output signals, a gate operator, and a gate expression.

27. The program storage device of claim 26 wherein said gate expression developed in said design method further comprises one or more of the following expressions: a mux select expression, an arithmetic expression, a logical expression, a multiple output expression, a capacitance isolation expression, or a shared node expression.

28. The program storage device of claim 26 wherein said signal output variable developed in said design method further comprises a 1-of-N N-NARY signal degree identifier, an evaluation indicator, and a evaluation clock phase indicator.

29. The program storage device of claim 28 wherein said evaluation indicator developed in said design method further comprises information identifying whether said one or more 1-of-N output signals are valid N-NARY signals that have completed evaluation or whether said one or more 1-of-N output signals represent a null value.

30. The program storage device of claim 25 wherein said compiler further comprises a transistor synthesis tool and a make-model component, said make-model component further comprising a pre-compiler.

* * * * *